(12) United States Patent
Jin et al.

(10) Patent No.: US 10,050,078 B2
(45) Date of Patent: Aug. 14, 2018

(54) LIGHT SENSOR

(71) Applicant: Samsung Electronics Co., Ltd., Suwon-si, Gyeonggi-do (KR)

(72) Inventors: Younggu Jin, Suwon-si (KR); Changrok Moon, Seoul (KR); Duckhyung Lee, Seongnam-si (KR); Seokha Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/798,387

(22) Filed: Oct. 30, 2017

(65) Prior Publication Data

US 2018/0182806 A1  Jun. 28, 2018

(30) Foreign Application Priority Data

Dec. 28, 2016 (KR) .................. 10-2016-0181310

(51) Int. Cl.
*H01L 27/146* (2006.01)
*G02B 27/10* (2006.01)

(52) U.S. Cl.
CPC .... *H01L 27/14649* (2013.01); *H01L 27/1462* (2013.01); *H01L 27/1463* (2013.01); *H01L 27/14627* (2013.01); *H01L 27/14629* (2013.01); *H01L 27/14634* (2013.01); *H01L 27/14636* (2013.01); *H01L 27/14685* (2013.01); *G02B 27/10* (2013.01)

(58) Field of Classification Search
CPC ... G02B 27/10–27/16; H01L 27/14627; H01L 27/14649; H01L 27/1465
See application file for complete search history.

(56) References Cited

U.S. PATENT DOCUMENTS

| | | |
|---|---|---|
| 8,941,200 B2 | 1/2015 | Egawa |
| 8,946,610 B2 | 2/2015 | Iwabuchi et al. |
| 8,970,751 B2 | 3/2015 | Egawa |
| 9,313,433 B2 | 4/2016 | Nakajima et al. |
| 9,577,012 B2 | 2/2017 | Ooki et al. |
| 9,853,073 B2 * | 12/2017 | Roh .................. H01L 27/14621 |
| 2010/0276572 A1 | 11/2010 | Iwabuchi et al. |

(Continued)

FOREIGN PATENT DOCUMENTS

| | | |
|---|---|---|
| JP | 2013033864 A | 2/2013 |
| JP | 2014195112 A | 10/2014 |

(Continued)

*Primary Examiner* — Daniel Shook
(74) *Attorney, Agent, or Firm* — Renaissance IP Law Group LLP

(57) ABSTRACT

A first substrate includes a plurality of unit pixel regions. A deep trench isolation structure is disposed in the first substrate and isolates each of the plurality of the unit pixel regions from each other. Each of a plurality of photoelectric converters is disposed in one of the plurality of unit pixel regions. A plurality of micro lenses are disposed on the first substrate. A plurality of light splitters are disposed on the first substrate. Each of the plurality of light splitters is disposed between one of the plurality of micro lenses and one of the plurality of photoelectric converters. Each of a plurality of photoelectric-conversion-enhancing layers is disposed between one of the plurality of light splitters and one of the plurality of photoelectric converters.

20 Claims, 34 Drawing Sheets

(56) References Cited

U.S. PATENT DOCUMENTS

| | | |
|---|---|---|
| 2013/0181114 A1 | 7/2013 | Egawa |
| 2014/0021574 A1 | 1/2014 | Egawa |
| 2014/0146208 A1 | 5/2014 | Nakajima et al. |
| 2015/0171146 A1 | 6/2015 | Ooki et al. |
| 2016/0054172 A1 | 2/2016 | Roh et al. |

FOREIGN PATENT DOCUMENTS

| | | |
|---|---|---|
| JP | 2015220313 A | 12/2015 |
| JP | 2016001633 A | 1/2016 |

* cited by examiner

LIGHT SENSOR

CROSS-REFERENCE TO RELATED APPLICATION

This application claims priority under 35 U.S.C. § 119 to Korean Patent Application No. 10-2016-0181310, filed on Dec. 28, 2016, in the Korean Intellectual Property Office, the disclosure of which is incorporated by reference herein in its entirety.

TECHNICAL FIELD

The present inventive concept relates to a light sensor.

DISCUSSION OF RELATED ART

Infrared light is electromagnetic waves whose wavelengths are longer than those of visible light, and are in a range of about 0.75 µm to about 1000 µm. Infrared light may be classified into three regions of near-infrared (0.75 µm to 1.5 µm), mid-infrared (1.5 µm to 5.6 µm), and far-infrared (5.6 µm to 1000 µm). The wavelength of near-infrared light is longer than that of visible light, and thus the quantum efficiency of photoelectric converters of light sensors using near-infrared light may be very low.

SUMMARY

According to an exemplary embodiment of the present inventive concept, a light sensor is provided as follows. A first substrate includes a plurality of unit pixel regions. A deep trench isolation structure is disposed in the first substrate and isolates each of the plurality of unit pixel regions from each other. Each of a plurality of photoelectric converters is disposed in one of the plurality of unit pixel regions. A plurality of micro lenses are disposed on the first substrate. A plurality of light splitters are disposed on the first substrate, with each of the plurality of light splitters disposed between one of the plurality of micro lenses and one of the plurality of photoelectric converters. Each of a plurality of photoelectric-conversion-enhancing layers is disposed between one of the plurality of light splitters and one of the plurality of photoelectric converters.

According to an exemplary embodiment of the present inventive concept, a light sensor is provided as follows. A substrate having a first surface and a second surface opposite to the first surface includes a plurality of unit pixel regions. A photoelectric converter is disposed in each of the plurality of unit pixel regions of the substrate. A micro lens is disposed on the second surface of the substrate and overlaps one of the plurality of unit pixel regions. A light splitter is disposed between the micro lens and the photoelectric converter. A photoelectric-conversion-enhancing layer is disposed between the light splitter and the photoelectric converter. The light splitter is disposed at a focal point of the micro lens.

According to an exemplary embodiment of the present inventive concept, a light sensor is provided as follows. A substrate has an array of a plurality of unit pixel regions including a first unit pixel region and a second unit pixel region. Each of the plurality of unit pixel regions includes a photoelectric converter. A plurality of light splitters, including a first light splitter and a second light splitter, is disposed on the substrate. The first light splitter is disposed at a first distance from the center of the first unit pixel region and the second light splitter is disposed at a second distance from the center of the second unit pixel region. The second distance is larger than the first distance. A plurality of micro lens includes a first micro lens and a second micro lens that overlaps the first light splitter and the second light splitter, respectively. The center of the first micro lens and the center of the second micro lens are directly above the center of the first unit pixel region and the center of the second unit pixel region, respectively.

BRIEF DESCRIPTION OF DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
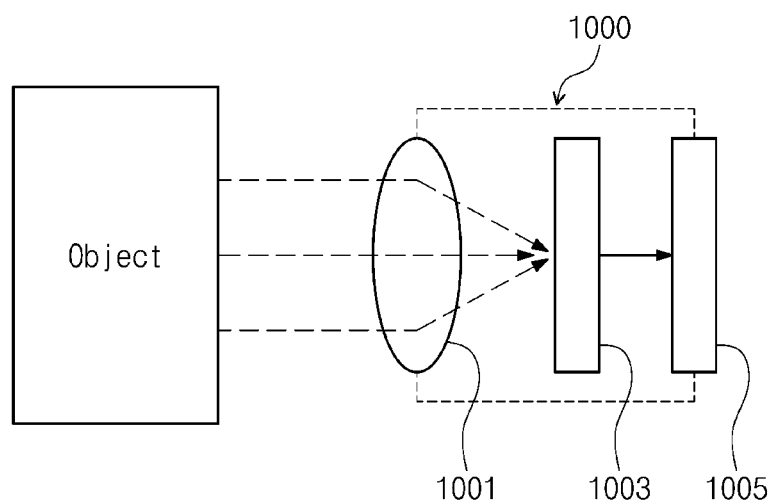
FIG. 1 is a schematic diagram illustrating an image processing device according to an exemplary embodiment of the present inventive concept.

Exemplary embodiments of the present inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The values such as thickness and width of a constituent element may be expressed using "substantially the same" or "about", because the values measured in an image sensor device fabricated according to the present inventive concept may be different from the exact value claimed below due to a process variation for forming the image sensor device or due to a measurement error.

FIG. 1 is a schematic diagram illustrating an image processing device according to an exemplary embodiment of the present inventive concept.

In FIG. 1, the image processing device 1000 may include a lens 1001 transmitting light generated from an object, a light sensor 1003 sensing the light transmitted from the lens 1001, and a display part 1005 displaying image data generated from the light sensor 1003. In an exemplary embodiment, the light sensor 1003 may sense infrared light other than visible light. In this case, the image processing device 1000 may also include an infrared filter disposed on a surface of the lens 1001 or between the lens 1001 and the light sensor 1003 to transmit only the infrared light generated from the object. In another exemplary embodiment, the light sensor 1003 may sense visible light. In this case, the image processing device 1000 may not include the infrared filter. The light sensor 1003 may include a circuit part that stores and processes electrical signals converted from infrared light received through the lens 1001. In an exemplary embodiment, the circuit part may be provided as an additional device separated from the light sensor 1003 and may be connected between the light sensor 1003 and the display part 1005.

Figure 2:
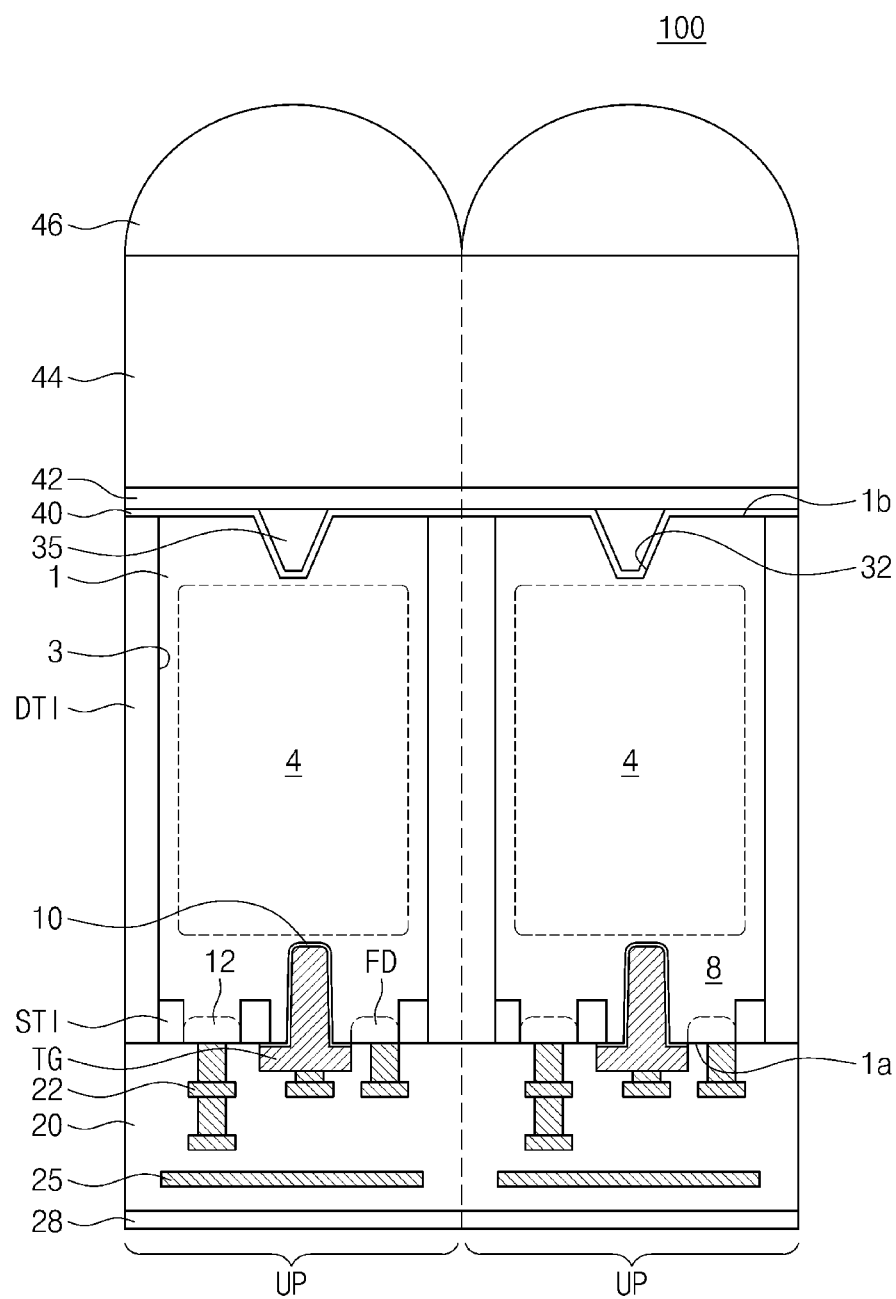
FIG. 2 is a cross-sectional view illustrating a light sensor according to an exemplary embodiment of the present inventive concept.

FIG. 2 is a cross-sectional view illustrating a light sensor according to an exemplary embodiment of the present inventive concept.

In FIG. 2, a light sensor 100 may include a substrate 1 including a plurality of unit pixel regions UP. The substrate 1 may include a single-crystalline silicon substrate, a silicon-on-insulator (SOI) substrate, or a silicon epitaxial layer. The substrate 1 may include a first surface 1a (or a bottom surface) and a second surface 1b (or a top surface) opposite to each other. Infrared light may be incident on the second surface 1b.

Circuits may be disposed on the first surface 1a. A shallow trench isolation layer STI may be disposed at the first surface 1a to define an active region. For example, the shallow trench isolation layer STI may extend from the first surface 1a into the substrate 1.

A device isolation region doped with impurities may be disposed inside of the shallow trench isolation layer STI.

The unit pixel regions UP may be isolated from each other by a deep trench isolation structure DTI. The deep trench isolation structure DTI may penetrate the substrate 1 between the first surface 1a of the substrate 1 and the second surface 1b of the substrate 1. The deep trench isolation structure DTI may have a mesh shape when viewed in a plan view. For example, the deep trench isolation structure DTI may surround each of the plurality of unit pixel regions UP. The light sensor 100 may include the deep trench isolation structure DTI isolating the plurality of unit pixel regions UP from each other to prevent crosstalk between adjacent unit pixel regions UP. For example, without the deep trench isolation structure DTI according to an exemplary embodiment, infrared light coming into one of the plurality of unit pixel regions UP may enter another unit pixel region or may be reflected to enter another unit pixel region adjacent to the one of the plurality of unit pixel regions UP receiving the infrared light.

The deep trench isolation structure DTI may include an insulating material layer such as a silicon oxide layer, a silicon nitride layer, a silicon oxynitride layer, or a combination thereof. In addition, the deep trench isolation structure DTI may include a poly-silicon pattern disposed therein. A voltage may be applied to the poly-silicon pattern to reduce dark current and prevent a white spot from being displayed on the display part 1005 of FIG. 1.

A first impurity injection region 8 and a second impurity injection region 4 may be disposed in the substrate 1. The first impurity injection region 8 may be doped with impurities of a first conductivity type, and the second impurity injection region 4 may be doped with impurities of a second conductivity type different from the first conductivity type. For example, the first impurity injection region 8 may be doped with P-type impurities, and the second impurity injection region 4 may be doped with N-type impurities. The first impurity injection region 8 and the second impurity injection region 4 may constitute a photoelectric converter (e.g., a photodiode). In an exemplary embodiment, the second impurity injection region 4 may be surrounded by the first impurity injection region 8.

A transfer gate TG, a floating diffusion region FD, and a ground region 12 may be disposed at the first surface 1a. The transfer gate TG may have a vertical-type gate shape that includes a portion extending into the substrate 1. In an exemplary embodiment, the transfer gate TG may have a flat-type gate shape that is disposed on the first surface 1a of the substrate 1. A gate insulating layer 10 may be disposed between the transfer gate TG and the substrate 1. The floating diffusion region FD may be doped with impurities of the same conductivity type as the second impurity injection region 4. For example, the floating diffusion region FD may be doped with N-type impurities. The ground region 12 may be doped with impurities of the same conductivity type as the first impurity injection region 8, and the doping concentration of the impurities of the ground region 12 may be higher than that of the impurities of the first impurity injection region 8.

When a voltage is applied to the transfer gate TG, a transistor including the transfer gate TG may be turned-on to transfer charges generated in the first impurity injection region 8 and the second impurity injection region 4 into the floating diffusion region FD. The charges accumulated in the floating diffusion region FD may be transmitted to the outside of the unit pixel region UP by other transistors (e.g., a source follower transistor, a reset transistor, and a selection transistor) or interconnection lines, or a combination thereof.

An interlayer insulating layer 20 and interconnection lines 22 may be disposed on the first surface 1a. The interlayer insulating layer 20 may be covered with a passivation layer 28. A first reflector 25 may be disposed in the interlayer insulating layer 20. The first reflector 25 may have a flat plate shape occupying a considerable portion of each of the plurality of unit pixel regions UP when viewed in a plan view or viewed from the above of the light sensor 100. In an exemplary embodiment, infrared light incoming into one of the plurality of pixel regions UP through the second surface 1b may travel to the interlayer insulating layer 20, and the first reflector 25 may reflect the infrared light to re-enter the same pixel region UP where the infrared light enters. Accordingly, the first reflector 25 may have an area sufficient that the first reflector 25 may prevent the infrared light arriving at the interlayer insulating layer 20 from passing through the interlayer insulating layer 20.

The first reflector 25 may be formed of a portion of the interconnection lines 22. In this case, the first reflector 25 may be part of a signal path formed by the interconnection lines 22. In an exemplary embodiment, the first reflector 25 may be formed in an additional metal layer separated from the interconnection lines 22. In this case, the first reflector 25 need not be part of a signal path formed by the interconnection lines 22.

A recess region 32 may be formed in the substrate 1 by recessing partially the second surface 1b toward the first surface 1a. A sidewall of the recess region 32 may form an obtuse angle with the second surface 1b. An entrance of the recess region 32 may be wider than a bottom surface of the recess region 32.

A fixed charge layer 40 may be disposed on the second surface 1b. The fixed charge layer 40 may be in contact with the substrate 1 and may conformally cover an inner surface of the recess region 32. The fixed charge layer 40 may include a metal oxide layer containing insufficient oxygen in terms of a stoichiometric ratio or a metal fluoride layer containing insufficient fluorine in terms of a stoichiometric ratio. Thus, the fixed charge layer 40 may have negative fixed charges. The fixed charge layer 40 may include a metal oxide layer or metal fluoride layer including at least one of hafnium (Hf), zirconium (Zr), aluminum (Al), tantalum (Ta), titanium (Ti), yttrium (Y), and a lanthanoid (Ln). For example, the fixed charge layer 40 may be a hafnium oxide layer or an aluminum fluoride layer. In the fixed charge layer 40 adjacent to the second surface 1b, holes may be accumulated. Thus, dark current and any white spots may be effectively reduced. For example, when infrared light passes through the first impurity injection region 8 and the second impurity injection region 4 (collectively referred to as a photoelectric converter or a photodiode), a plurality of electron-hole pairs may be generated in the first impurity injection region 8 and the second impurity injection region 4. In this case, the holes of the plurality of electron-hole pairs may be accumulated in the fixed charge layer 40; and the electrons of the plurality of electron-hole pairs may be accumulated in the floating diffusion region FD.

A light splitter 35 may be disposed in the recess region 32 whose inner surface is conformally covered with the fixed charge layer 40. The light splitter 35 may be in contact with the fixed charge layer 40. In an exemplary embodiment, the light splitter 35 may be formed of a material having a different refractive index from the substrate 1. For example, the light splitter 35 may be formed of a material whose refractive index is lower than a refractive index of silicon of the substrate 1. For example, the light splitter 35 may include at least one of a silicon oxide layer, a silicon nitride layer, a silicon oxynitride layer, and a metal oxide layer. A top surface of the light splitter 35 may be substantially coplanar with a top surface of the fixed charge layer 40 disposed on the second surface 1b at substantially the same height from the first surface 1a of the substrate 1. The sidewall of the recess region 32 may be spaced apart from the deep trench isolation structure DTI. In an exemplary embodiment, the light splitter 35 may be provided in plural. For example, each of the plurality of pixel regions UP may each have one light splitter 35.

An anti-reflection layer 42 may cover the fixed charge layer 40 and the light splitter 35. For example, the anti-reflection layer 42 may include a silicon nitride layer.

A planarization layer 44 may be disposed on the anti-reflection layer 42. The planarization layer 44 may include a silicon oxide layer or a photoresist layer not including a pigment. In an exemplary embodiment, the planarization layer 44 may include a pigment. When a pigment is included, a color filter need not be present in the light sensor 100. The planarization layer 44, when including a pigment, may serve as a color filter instead of a separate color filter element.

A plurality of micro lenses 46 may be disposed on the planarization layer 44. Each of the plurality of micro lenses 46 may be disposed on one of the plurality of unit pixel regions UP.

When an infrared filter is disposed between the lens 1001 and the light sensor 1003 of FIG. 1 senses infrared light through the light sensor 100, the light sensor 100 does not require a color filter to filter a specific color of light. In this case, the planarization layer 44 does not require a pigment or a color filter. Even when a color filter is disposed on the planarization layer 44, or when the planarization layer 44 includes a pigment, the infrared light may pass through the color filter or the planarization layer 44 with a pigment, as the infrared light may be unaffected by color filtering due to its longer wavelength.

Figure 3:
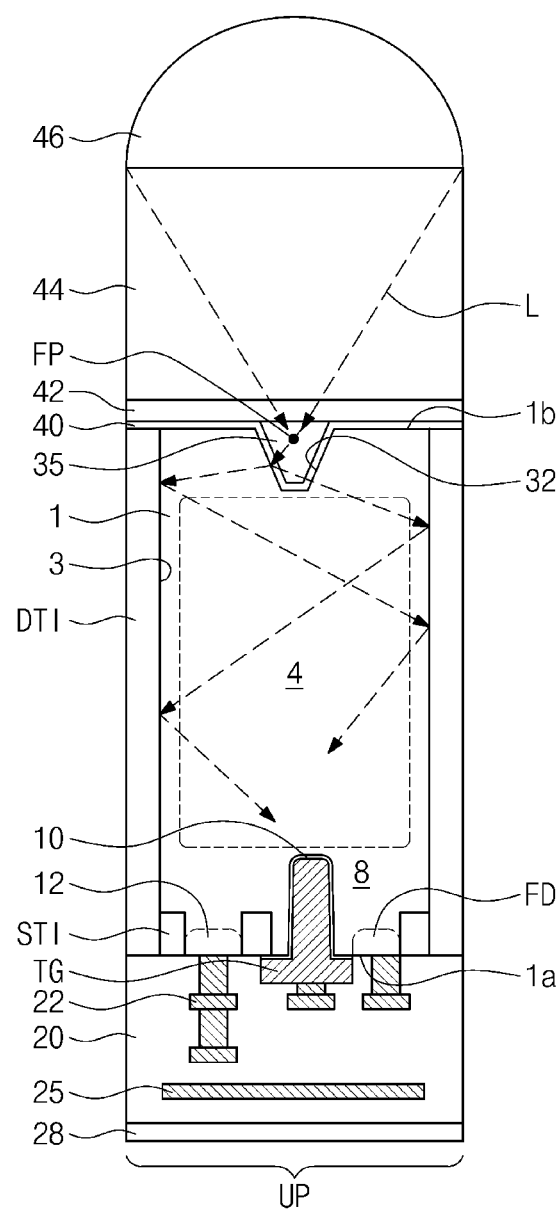
FIG. 3 is a cross-sectional view illustrating a path of light in the light sensor of FIG. 2 according to an exemplary embodiment of the present inventive concept.

FIG. 3 is a cross-sectional view illustrating a path of light in the light sensor of FIG. 2.

In FIG. 3, light L may travel to the light splitter 35 through the micro lens 46. Since a surface of the micro lens 46 is convex, the light L may be focused at one spot (a focal point FP). The light splitter 35 may be disposed at the spot where the light L is focused. For example, the light splitter 35 may be disposed at the focal point FP of the micro lens 46. Infrared light or red light included in the light L may have a low absorption factor in the substrate 1 because of its long wavelength. In other words, the infrared light or red light of the light L may pass through the substrate 1 having a lower chance to generate an electron-hole pair. As such, the quantum efficiency of infrared light or red light may be lower compared to other, shorter wavelength, visible light of the light L. The quantum efficiency includes the rate at which light is converted into charge.

In an exemplary embodiment, the light sensor 100 may include the light splitter 35, and thus the light L may be scattered and split into a plurality of rays at an interface between the light splitter 35 and the substrate 1. The plurality of rays of the light L may travel through a plurality of paths, respectively, so that each of the plurality of rays of the light L may have an increased light path (represented by dashed lines, for example) by being reflected by the deep trench 3. For example, the plurality of paths may include reflections, such as off the deep trench isolation structure DTI surrounding each of the plurality of unit pixel regions UP. The increased path of the plurality of rays may include reflection by a shallow trench isolation layer STI or the first reflector 25. Thus, the scattering of the light L by the light splitter 35 may induce multiple reflections to increase the light path within the unit pixel region UP. As a result, the absorption factor of, e.g., the infrared light or red light may increase in the light sensor 100, and the quantum efficiency of the infrared light or red light may increase in the light sensor 100.

The first reflector 25 may reflect the light L, which is incident into the interlayer insulating layer 20, into the substrate 1 to increase the absorption factor of the light L.

Figure 4A:
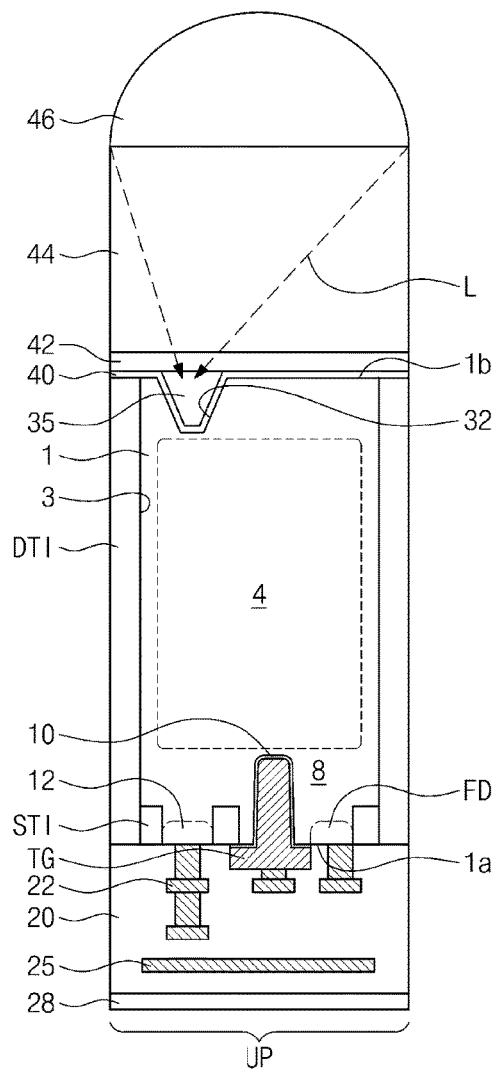
FIGS. 4A and 4B are cross-sectional views illustrating light sensors according to an exemplary embodiment of the present inventive concept.
Figure 4B:
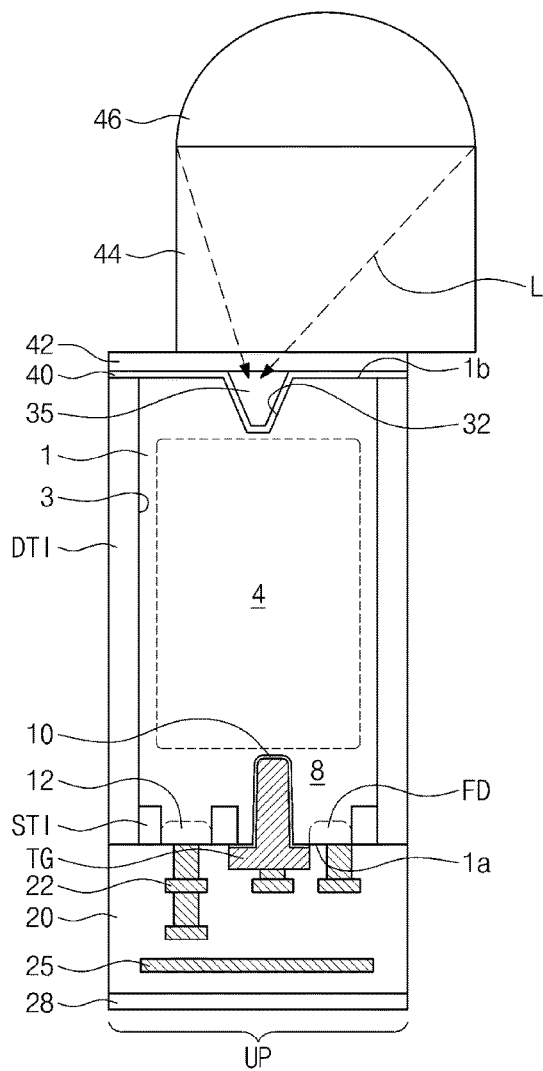
Figure 5:
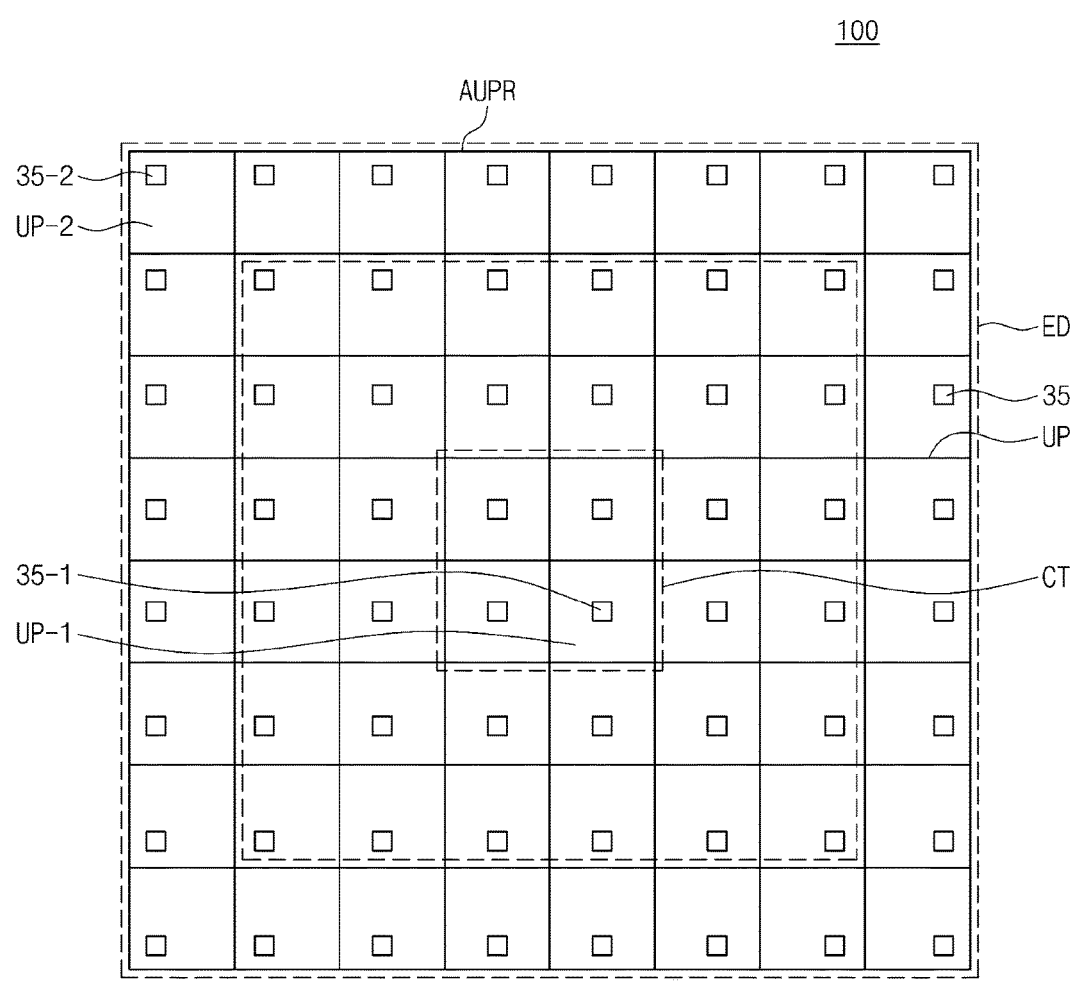
FIG. 5 is a plan view illustrating a light sensor according to an exemplary embodiment of the present inventive concept.
Figure 6:
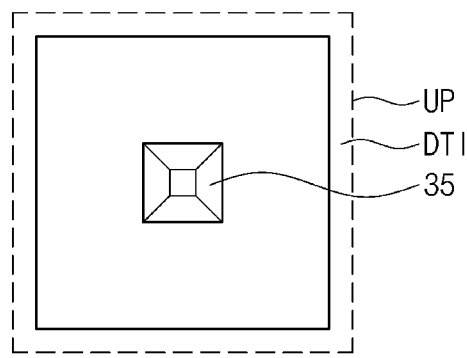
FIGS. 6 to 9 are plan views illustrating planar shapes of light splitters according to an exemplary embodiment of the present inventive concept.
Figure 7:
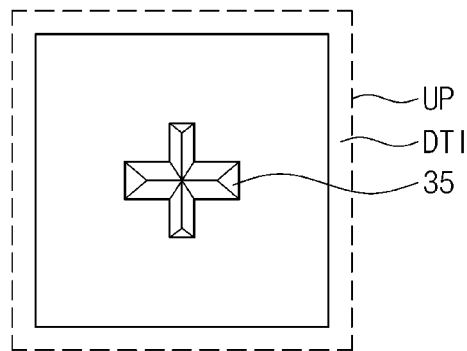
Figure 8:
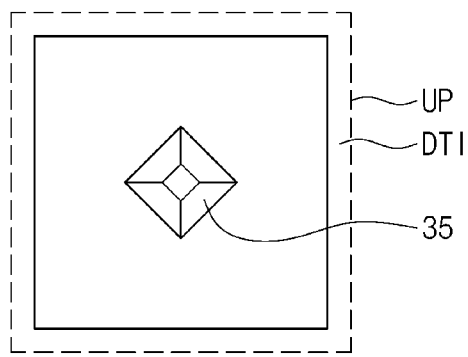
Figure 9:
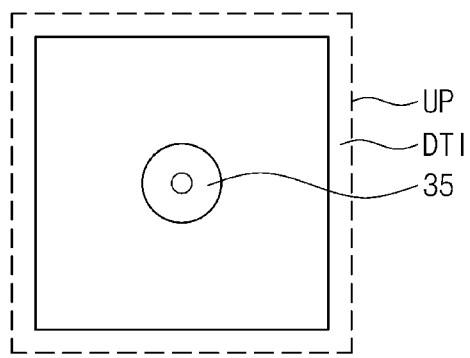

FIGS. 4A and 4B are cross-sectional views illustrating light sensors according to an exemplary embodiment of the present inventive concept. FIG. 5 is a plan view illustrating a light sensor according to an exemplary embodiment of the present inventive concept.

In an exemplary embodiment, depending on the location of each of the plurality of unit pixel regions UP in the light sensor 100, each of the plurality of unit pixel regions UP may have different cross-sectional structure, as shown in FIGS. 3 and 4A, and 5. For example, FIG. 4A shows a cross-sectional view of a unit pixel region UP positioned in an edge region ED of FIG. 5; and FIG. 3 shows a cross-sectional view of a unit pixel region UP positioned in a central region CT of FIG. 5.

If light is vertically incident on the top surface of the substrate 1 in a central region CT of the light sensor 100, the light passing through the micro lens 46 may be focused at a central portion of the unit pixel region UP in the central region CT of the light sensor 100. Thus, the light splitter 35 may be disposed at the central portion of the unit pixel region UP as illustrated in FIG. 3.

If light is incident obliquely (e.g., at a low angle) in an edge region ED of the light sensor 100, the light passing through the micro lens 46 may be focused at an edge portion of the unit pixel region UP in the edge region ED of the light sensor 100 as illustrated in FIG. 4A. Thus, the light splitter 35 may be disposed adjacent to the deep trench isolation structure DTI in the unit pixel region UP in the edge region ED of the light sensor 100. In an exemplary embodiment, as illustrated in FIG. 4B, the position of the light splitter 35 may be fixed at the central portion of the unit pixel region UP in the edge region ED, and the position of the micro lens 46 may be laterally shifted to concentrate light passing through the micro lens 46 to the light splitter 35. For example, in each of the unit pixel regions UP, the light splitter 35 may be disposed at the spot where light passing through the micro lens 46 is focused, as illustrated in FIG. 5.

In FIG. 5, the light sensor 100 may include an array AUPR of a plurality of unit pixel regions UP including a first unit pixel region UP-1 and a second unit pixel region UP-2. Each of the plurality of unit pixel regions UP may include a photoelectric converter including the first impurity injection region 8 and the second impurity injection region 4 of FIG. 2. A plurality of light splitters 35 may be disposed on the substrate 1 of FIG. 2. The plurality of light splitters 35 may include a first light splitter 35-1 and a second light splitter 35-2. The first light splitter 35-1 may be disposed at a first distance from the center of the first unit pixel region UP-1 and the second light splitter 35-2 may be disposed at a second distance from the center of the second unit pixel region UP-2. The second distance is larger than the first distance. Each of the plurality of micro lens 46 may have a center that is directly above the center of each of the plurality of unit pixel regions UP. (See FIGS. 2 and 34, for example).

In an exemplary embodiment of the present inventive concept, the first unit pixel region UP-1 and the first light splitter 35-1 may be arranged as shown in FIG. 2. In this case, the first distance may be substantially zero so that the first light splitter 35-1 is disposed directly under the center of the first micro lens and at a focal point FP of the first micro lens, as shown in FIG. 2. The second unit pixel region UP-2 and the second light splitter 35-2 may be arranged as shown in FIG. 4A. In this case, the second distance may be greater than zero.

FIGS. 6 to 9 are plan views illustrating planar shapes of light splitters according to an exemplary embodiment of the present inventive concept.

In FIGS. 6 to 9, the light splitter 35 may have at least one of various planar shapes. For example, the light splitter 35 may have a square planar shape like FIG. 6 or may have a cross planar shape like FIG. 7. In an exemplary embodiment, the light splitter 35 may have a lozenge planar shape like FIG. 8, or may have a circular planar shape like FIG. 9. However, the present inventive concept is not limited thereto. The planar shape of the light splitter 35 may have various shapes.

A method of manufacturing the light sensor of FIG. 2 will be described hereinafter.

FIGS. 10 to 15 are cross-sectional views illustrating a method of manufacturing the light sensor 100 of FIG. 2.

Figure 10:
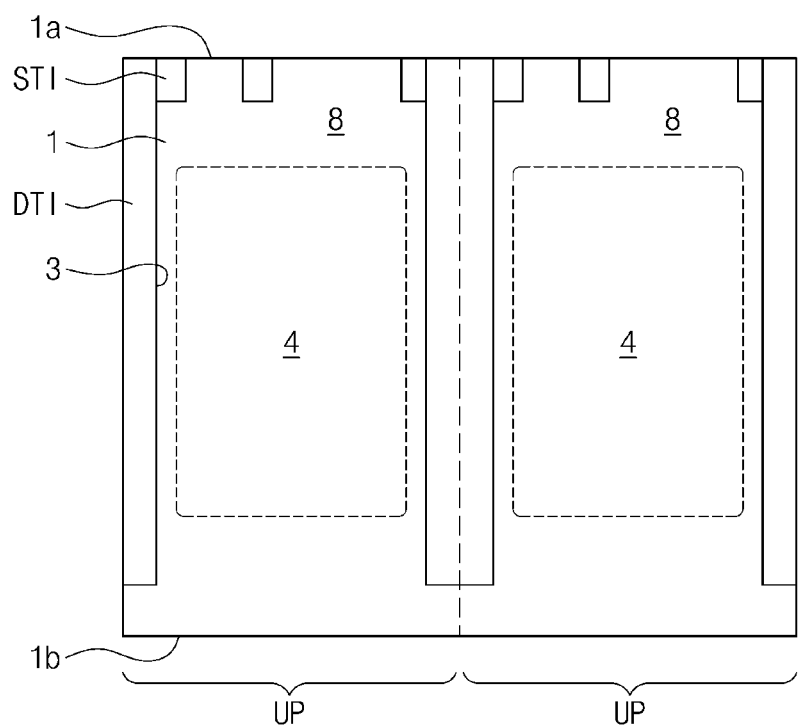
FIGS. 10 to 15 are cross-sectional views illustrating a method of manufacturing the light sensor of FIG. 2 according to an exemplary embodiment of the present inventive concept.

In FIG. 10, a deep trench isolation structure DTI may be formed in a substrate 1 having a first surface 1a and a second surface 1b opposite to each other, thereby isolating each of the plurality of unit pixel regions UP from each other. Now, a bottom surface of the deep trench isolation structure DTI may be spaced apart from the second surface 1b. The substrate 1 may be partially etched to form a deep trench 3, and an insulating material may be formed to fill the deep trench 3. A planarization process may be performed on the insulating material to form the deep trench isolation structure DTI. The deep trench isolation structure DTI may include at least one of a silicon oxide layer, a silicon nitride layer, and a silicon oxynitride layer. The deep trench isolation structure DTI may be formed in a mesh shape when viewed in a plan view so that the deep trench isolation structure DTI surrounds each of the plurality of unit pixel regions UP.

Next, ion implantation processes may be performed to form a first impurity injection region 8 and a second impurity injection region 4 in the substrate 1 of each of the unit pixel regions UP isolated from each other by the deep trench isolation structure DTI.

A shallow trench isolation layer STI may be formed in the substrate 1 adjacent to the first surface 1a to define active regions. Portions of the substrate 1 surrounded by the deep trench isolation structure DTI may be partially removed to form a shallow trench, and the shallow trench isolation layer STI may be formed by filling the shallow trench with a filling insulation layer.

Figure 11:
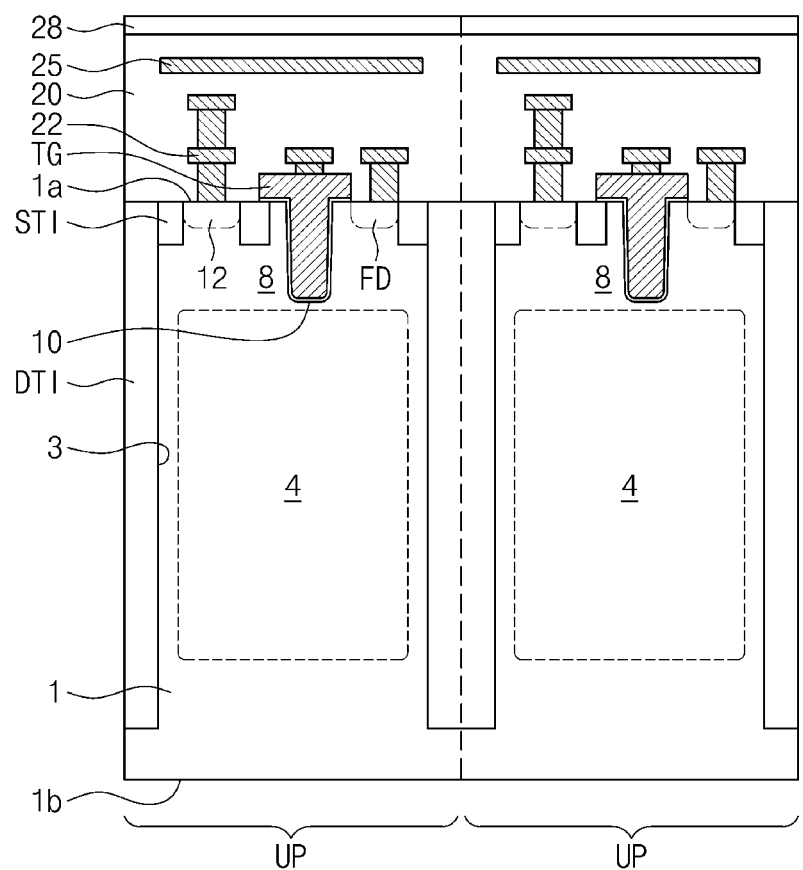

In FIG. 11, a portion of the substrate 1 exposed by the shallow trench isolation layer STI may be etched to form a recessed region, and a thermal oxidation process or a deposition process may be performed to form a gate insulating layer 10 conformally covering an inner surface of the recessed region and a surface (e.g., the top surface) of the substrate 1. A conductive layer may be formed to fill the recessed region, and a patterning process may be performed on the conductive layer to form a transfer gate TG. Even though not shown in the drawings, other gates having other functions may also be formed when the transfer gate TG is formed.

Ion implantation processes may be performed to form a floating diffusion region FD and a ground region 12 in the substrate 1 of each of the unit pixel regions UP. In an exemplary embodiment, the ion implantation processes may be performed after the formation of the transfer gate TG and the shallow trench isolation layer STI.

Interconnection lines 22, contact plugs, first reflectors 25, and an interlayer insulating layer 20 may be formed on the first surface 1a. The interlayer insulating layer 20 may cover or surround the interconnection lines 22, the contact plugs, and the first reflectors 25.

A passivation layer 28 may be formed on the interlayer insulating layer 20. The passivation layer 28 may be formed of a silicon nitride layer or a polyimide layer, or both.

Figure 12:
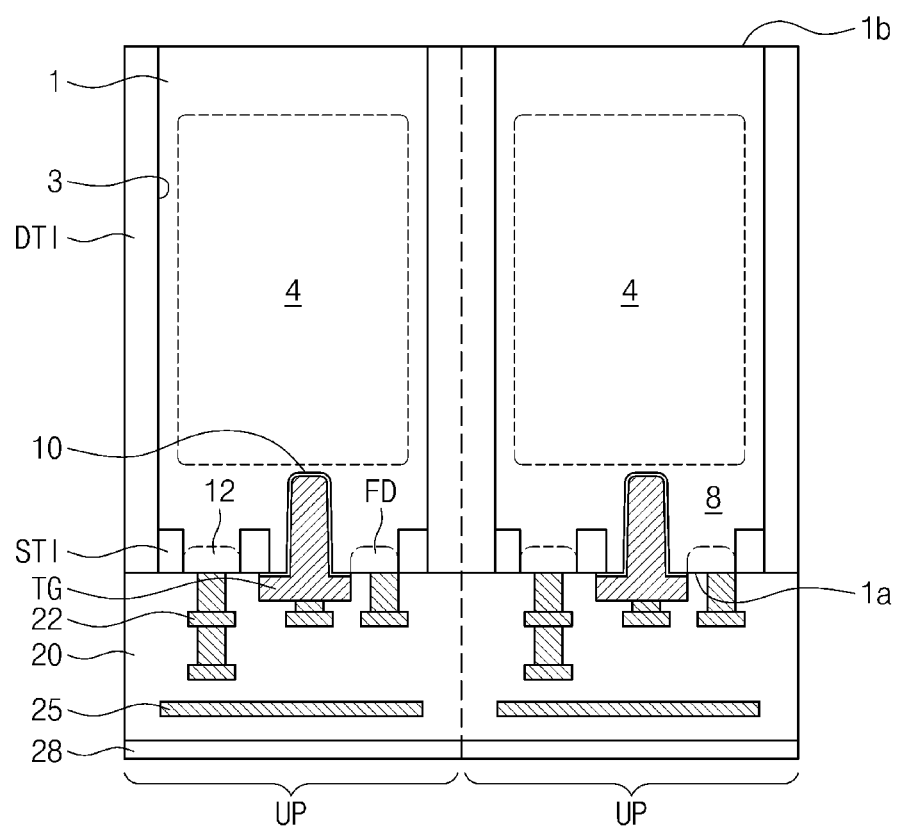

In FIG. 12, the substrate 1 may be turned over such that the second surface 1b may face upward. A back grinding process may be performed on the second surface 1b to remove a portion of the substrate 1 until the deep trench isolation structure DTI is exposed. In an exemplary embodiment, once the deep trench isolation structure DTI is exposed, the back grinding process may be further performed for a predetermined time to ensure that the deep trench isolation structure DTI is entirely exposed.

Figure 13:
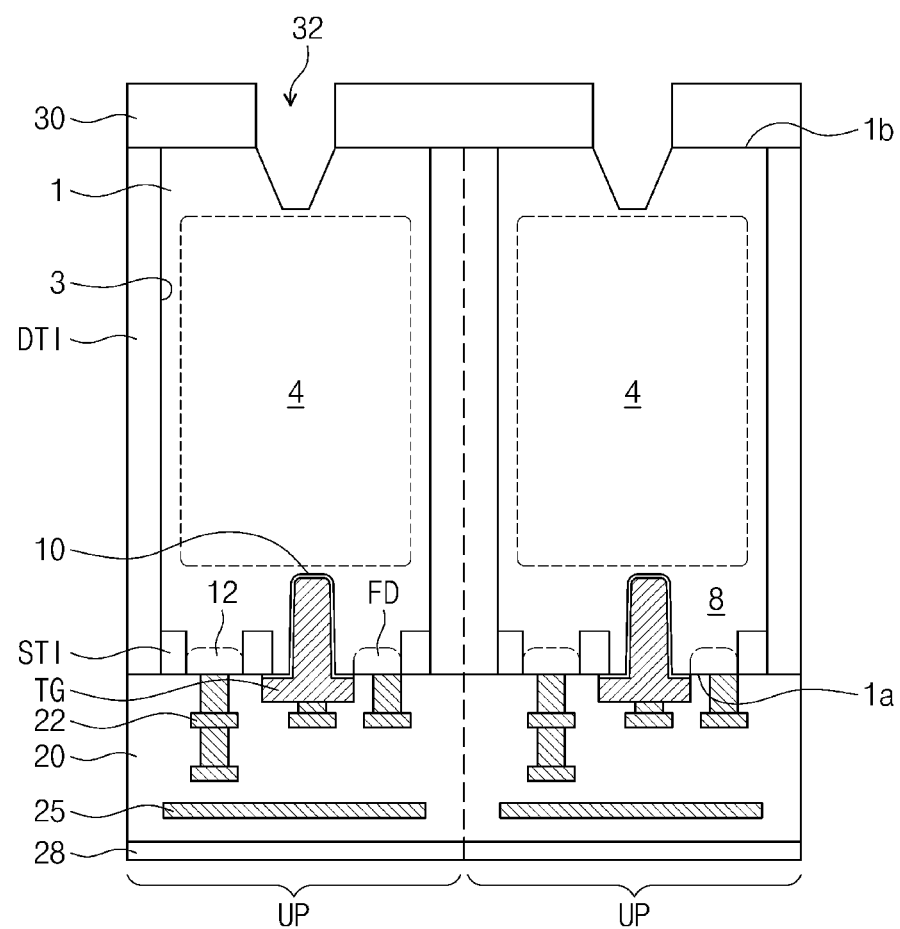

In FIG. 13, a mask pattern 30 may be formed on the second surface 1b. For example, the mask pattern 30 may include silicon nitride. The second surface 1b may be etched using the mask pattern 30 as an etch mask to form a recess region 32 in the substrate 1 of each of the unit pixel regions UP.

Figure 14:
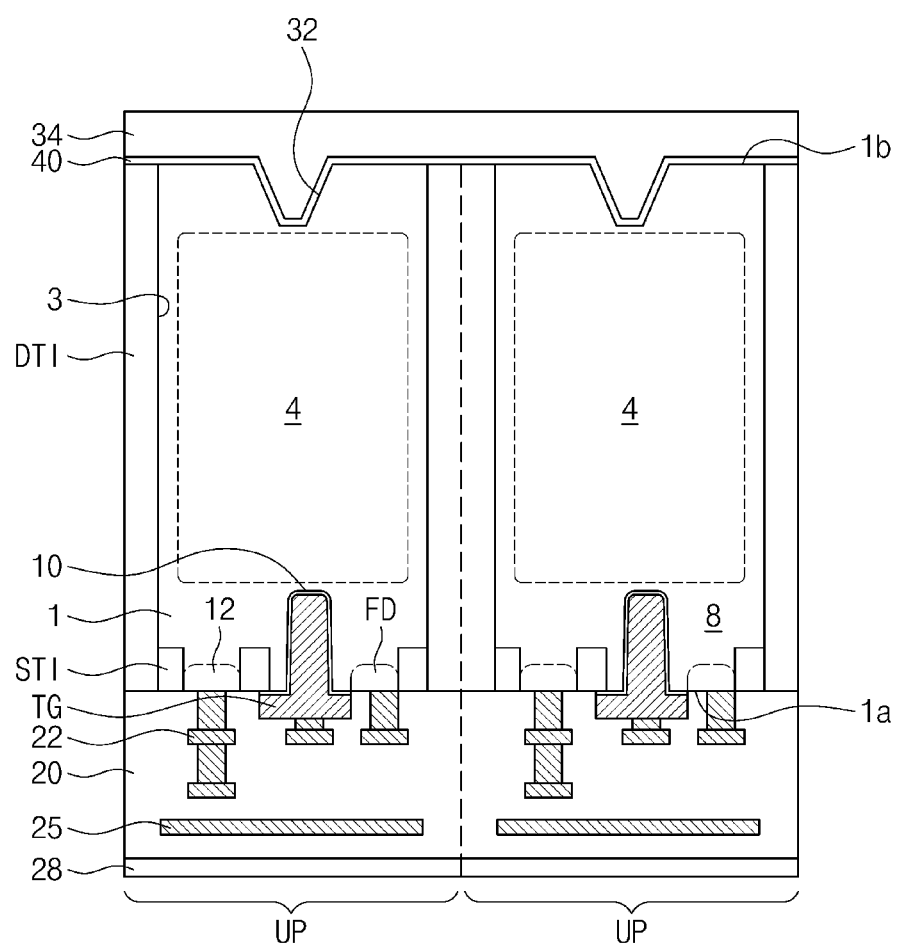

In FIG. 14, the mask pattern 30 may be removed to expose the second surface 1b. The fixed charge layer 40 may be conformally formed on the second surface 1b to cover a sidewall and a bottom surface of the recess region 32. A low refractive index layer 34 may be formed on the fixed charge layer 40 to fill the recess region 32. The low refractive index layer 34 may be formed of a material having a lower refractive index than silicon. For example, the low refractive index layer 34 may be formed of at least one of a silicon oxide layer, a silicon nitride layer, a silicon oxynitride layer, and a metal oxide layer.

Figure 15:
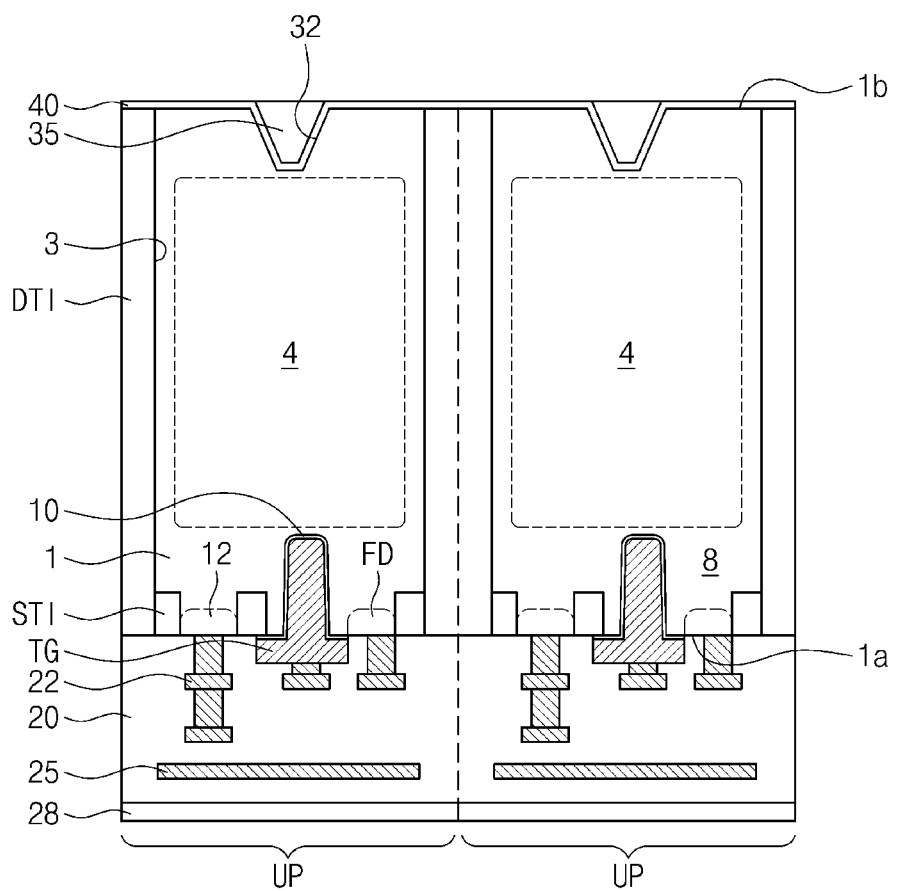

In FIG. 15, a planarization etching process may be performed on the low refractive index layer 34 to expose the fixed charge layer 40 disposed on the second surface 1b and to form a light splitter 35 in the recess region 32. For example, the light splitter 35 may correspond to the low refractive index layer 34 that remains in the recess region 32 after the planarization etching process is performed on the low refractive index layer 34.

Referring again to FIG. 2, an anti-reflection layer 42 and a planarization layer 44 may be sequentially formed on the second surface 1b. In an exemplary embodiment, the anti-reflection layer 42 and the planarization layer 44 may be formed on the entire surface of the second surface 1b of each unit pixel region UP. A micro lens 46 may be formed on the planarization layer 44.

In the present embodiment, the deep trench isolation structure DTI may be first formed before the formation of the constituent elements on the first surface 1a of the substrate 1. However, the present inventive concept is not limited thereto. For example, the constituent elements on the first surface 1a including shallow trench isolation layers STI, transistors and interconnection lines may be first formed on the first surface 1a, and then, the back grinding process may be performed on the second surface 1b. Thereafter, a portion of the substrate 1 may be etched from the second surface 1b to form a deep trench 3, and the deep trench isolation structure DTI may be formed by filling the deep trench 3 with an insulating layer. In this example, before the deep trench 3 is filled with the insulating layer, the recess region 32 may be formed in the substrate 1 adjacent to the second surface 1b and the fixed charge layer 40 may be conformally formed. In this case, the fixed charge layer 40 may conformally cover a sidewall and a bottom surface of the deep trench 3 as well as the sidewall and the bottom surface of the recess region 32.

Figure 16:
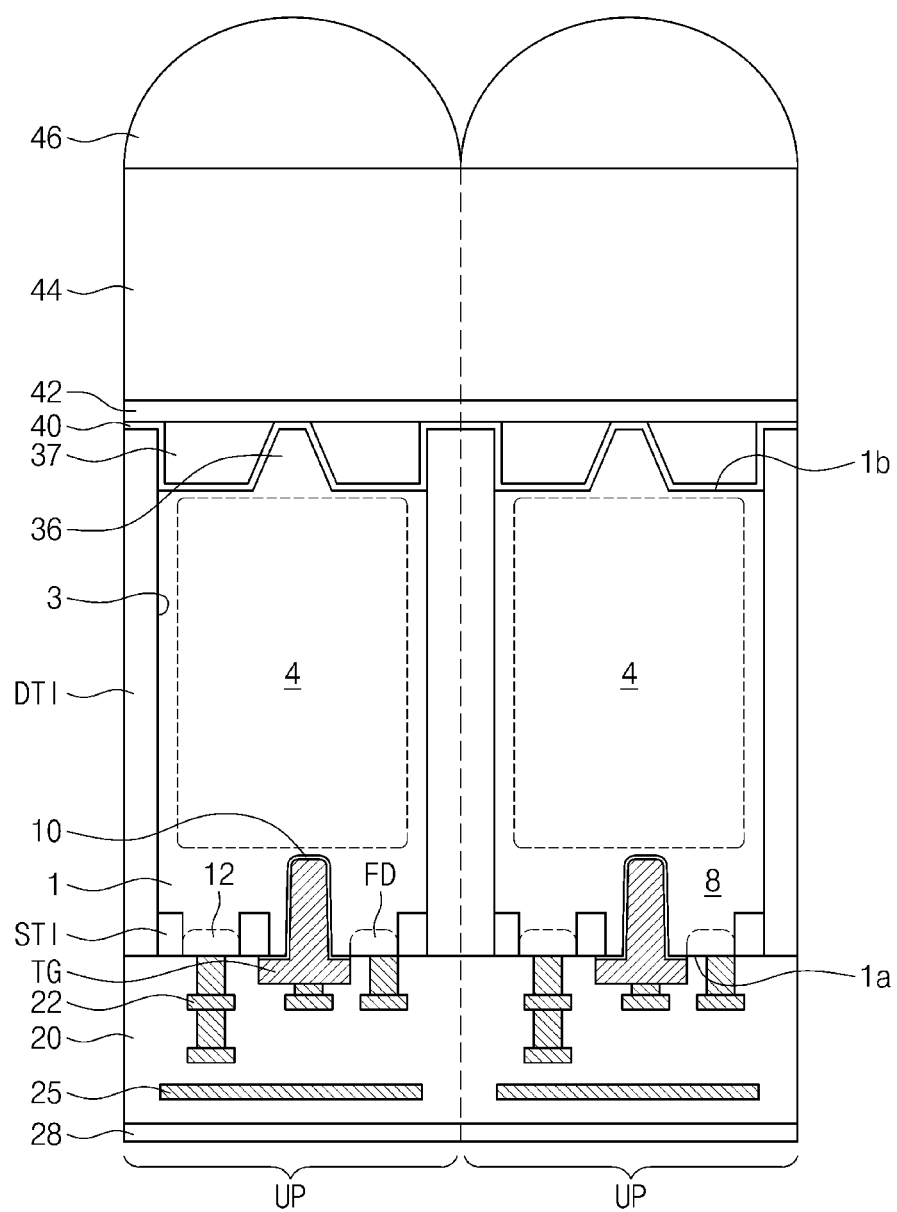
FIG. 16 is a cross-sectional view illustrating a light sensor according to an exemplary embodiment of the present inventive concept.

FIG. 16 is a cross-sectional view illustrating a light sensor according to an exemplary embodiment of the present inventive concept.

In FIG. 16, a light sensor 101 may include a light splitter 36. The light splitter 36 may be a portion of a substrate 1, which protrudes from a second surface 1b of the substrate 1. A lower portion of the light splitter 36 may be wider than an upper portion of the light splitter 36. A sidewall of the light splitter 36 may be inclined. The second surface 1b may be lower than a top surface of the deep trench isolation structure DTI, and a portion of a sidewall of the deep trench isolation structure DTI may be exposed from the second surface 1b.

The fixed charge layer 40 may conformally cover the portion of the sidewall and the top surface of the deep trench isolation structure DTI, the second surface 1b, and the sidewall and a top surface of the light splitter 36.

A refractive index difference part 37 may be disposed between the fixed charge layer 40 and an anti-reflection layer 42. In an exemplary embodiment, the refractive index difference part 37 may be formed of a material having a different refractive index from the substrate 1. For example, the refractive index difference part 37 may be formed of a material having a lower refractive index than silicon. For example, the refractive index difference part 37 may be formed of at least one of a silicon oxide layer, a silicon nitride layer, a silicon oxynitride layer, and a metal oxide layer.

The other components of the light sensor 101 of the present embodiment may be the same or similar as corresponding components of the light sensor 100 of FIG. 2. As described with reference to FIG. 2, light passing through the micro lens 46 may be scattered at the sidewall of the light splitter 36 in the light sensor 101. At least one of the deep trench isolation structure DTI, the first reflector 25, and the shallow trench isolation layer STI may serve as a reflector of the light passing through the micro lens 46. Thus, multiple reflections may be induced to increase the light path within the sensor. As a result, the light absorption factor of the light sensor 101 may increase.

The light sensor 101 of FIG. 16 may be manufactured by a similar method to the method of manufacturing the light sensor 100 of FIG. 2. The shape of the mask pattern 30 may be changed in FIG. 13. For example, the mask pattern 30 of FIG. 13 may be formed to cover a position, where the light splitter 36 of FIG. 16 will be formed, but to expose the remaining region of the substrate 1. The substrate 1 may be etched using the mask pattern 30 as an etch mask to form the light splitter 36 corresponding to a protruding portion of the substrate 1 and to expose a portion of the sidewall of the deep trench isolation structure DTI. Subsequently, the fixed charge layer 40 may be conformally formed. Next, a low refractive index layer may be formed to fill a space between the light splitter 36 and the deep trench isolation structure DTI, and a planarization etching process may be performed on the low refractive index layer to form the refractive index difference part 37. The other manufacturing processes may be the same or similar as described with reference to FIGS. 10 to 15.

Figure 17:
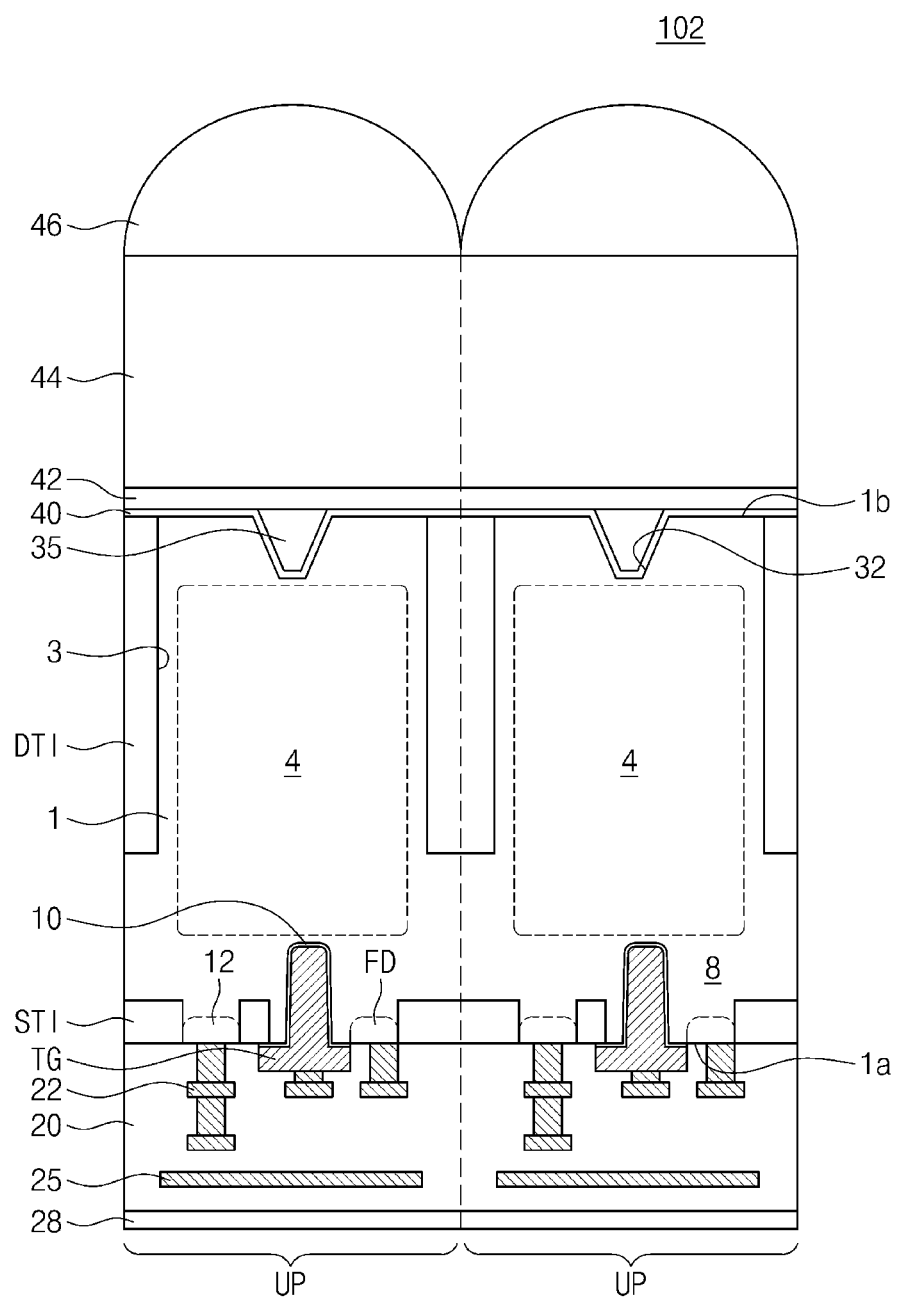
FIG. 17 is a cross-sectional view illustrating a light sensor according to an exemplary embodiment of the present inventive concept.

FIG. 17 is a cross-sectional view illustrating a light sensor according to an exemplary embodiment of the present inventive concept.

In FIG. 17, a light sensor 102 may include a deep trench isolation structure DTI extending from the second surface 1b toward the first surface 1a of the substrate 1 but need not be in contact with the first surface 1a.

In FIG. 17, the fixed charge layer 40 may be formed to cover a top surface of the deep trench isolation structure DTI. Even though not shown in the drawings, a poly-silicon pattern may be disposed within the deep trench isolation structure DTI, and a voltage may be applied to the poly-silicon pattern. In an exemplary embodiment, the fixed charge layer 40 may also extend onto an inner surface of the deep trench 3 in which the deep trench isolation structure DTI is disposed. The other components of the light sensor 102 may be the same or similar as corresponding components of the light sensor 100 described with reference to FIG. 2.

A method of manufacturing the light sensor 102 may be similar to the method of manufacturing the light sensor 100 of FIG. 2. However, the deep trench isolation structure DTI may be formed after performing the back grinding process on the second surface 1b. At this time, the deep trench 3 may extend from the second surface 1b toward the first surface 1a and may be spaced apart from the first surface 1a. The other manufacturing processes may be the same or similar as described with reference to FIGS. 10 to 15.

Figure 18:
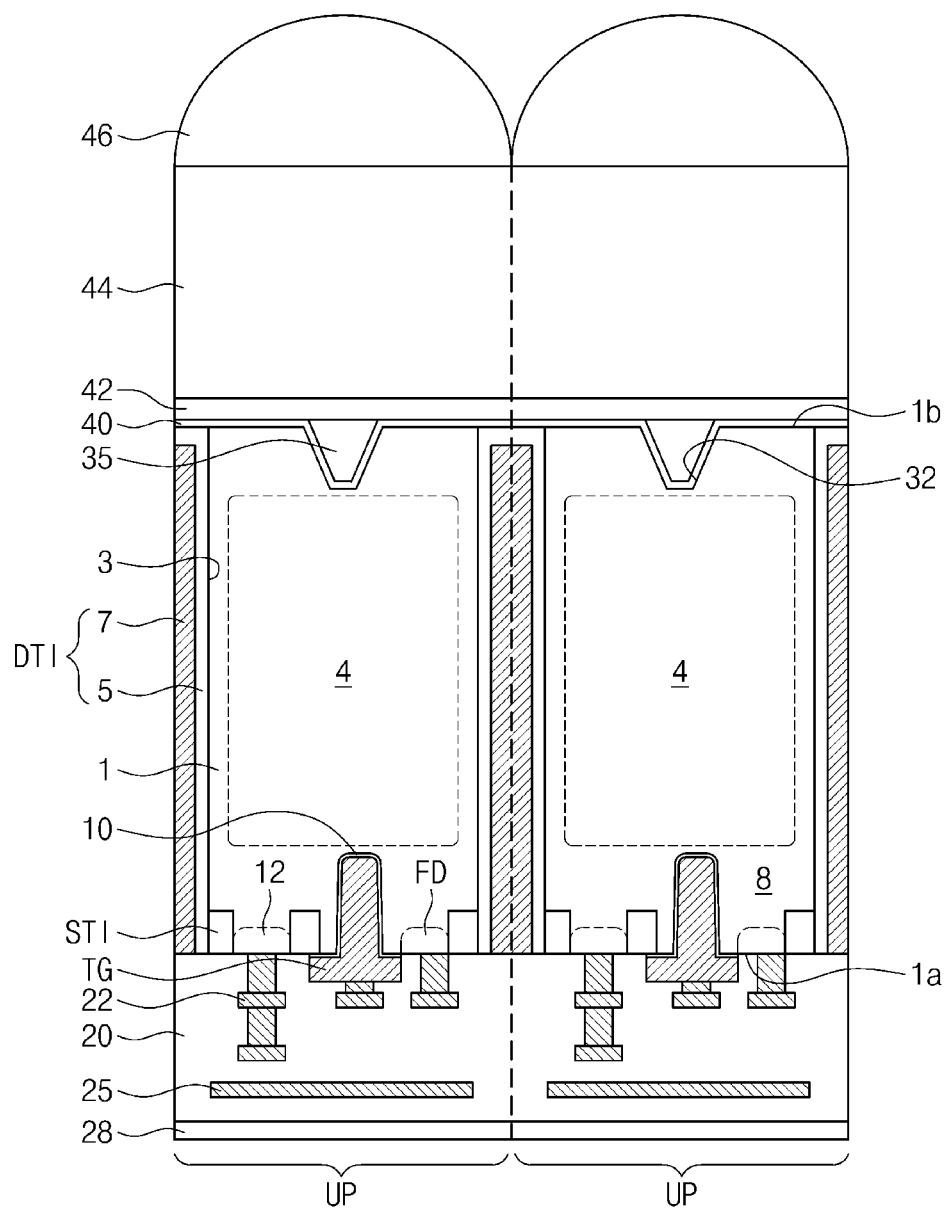
FIG. 18 is a cross-sectional view illustrating a light sensor according to an exemplary embodiment of the present inventive concept.

FIG. 18 is a cross-sectional view illustrating a light sensor according to an exemplary embodiment of the present inventive concept.

In FIG. 18, a light sensor 103 may include a deep trench isolation structure DTI including a second insulating part 5 conformally formed along an inner surface of a deep trench 3, and a second reflector 7 being in contact with the second insulating part 5 and filling the deep trench 3. The second reflector 7 may reflect light, which is incident on the sidewall of the deep trench isolation structure DTI, into the substrate 1 to increase the absorption factor of light. In addition, a voltage may be applied to the second reflector 7 to reduce a dark current or a white spot within the light sensor 103. The other components of the light sensor 103 may be the same or similar as corresponding components of the light sensor 100 of FIG. 2. In a method of manufacturing the light sensor 103, an insulating layer may be conformally formed after the formation of the deep trench 3 in the step of FIG. 10 and a metal layer may be formed to fill the deep trench 3. Subsequently, a planarization etching process may be performed to form the second insulating part 5 and the second reflector 7 constituting the deep trench isolation structure DTI. The other manufacturing processes may be the same or similar as described with reference to FIGS. 10 to 15.

Figure 19:
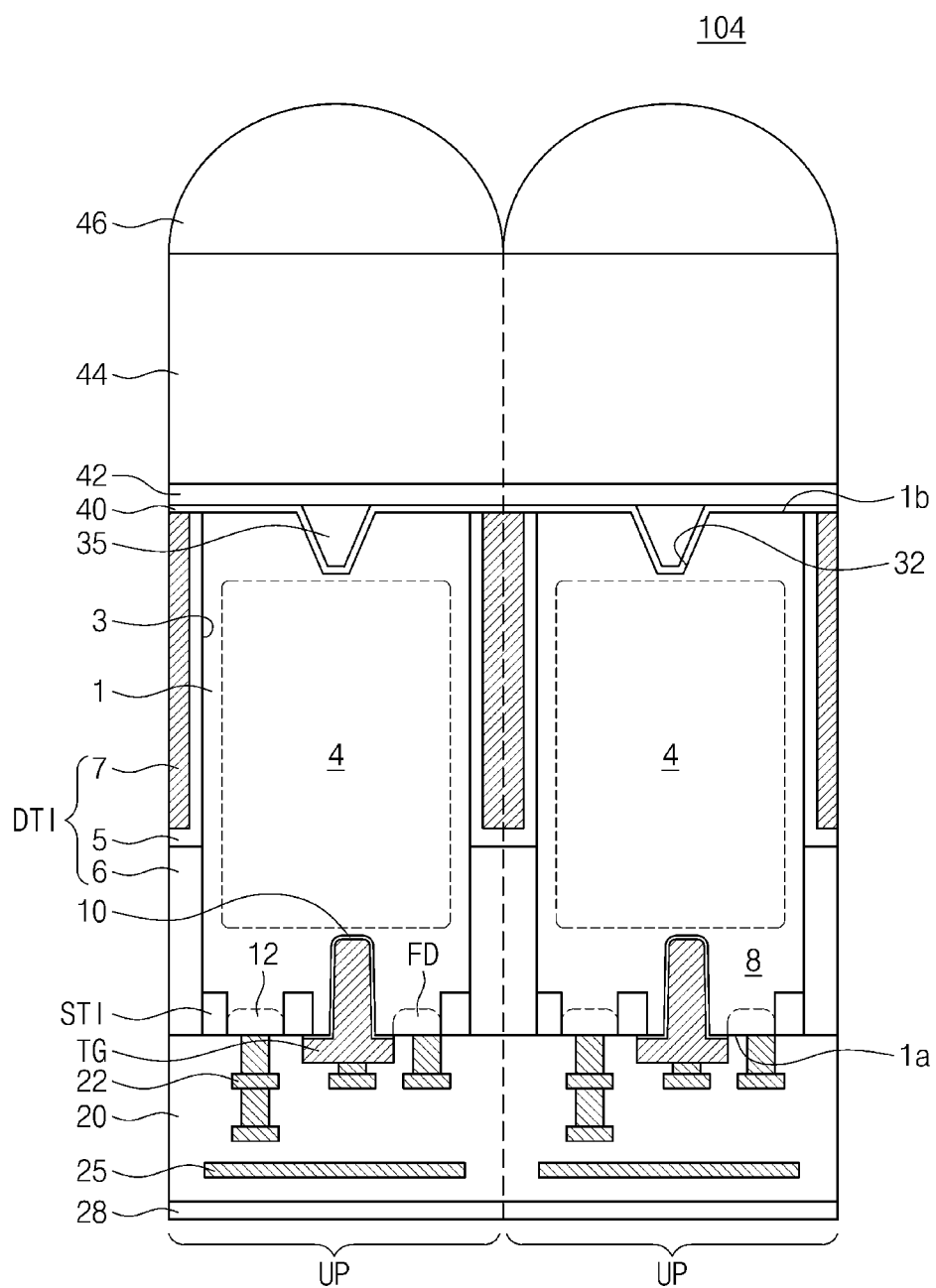
FIG. 19 is a cross-sectional view illustrating a light sensor according to an exemplary embodiment of the present inventive concept.

FIG. 19 is a cross-sectional view illustrating a light sensor according to an exemplary embodiment of the present inventive concept.

In FIG. 19, a light sensor 104 may include a deep trench isolation structure DTI including a first insulating part 6 partially extending from the first surface 1a toward the second surface 1b, a second insulating part 5 partially extending from the second surface 1b toward the first surface 1a, and a second reflector 7 disposed in the second insulating part 5. The other components of the light sensor 104 may be the same or similar as corresponding components of the light sensor 103 described with reference to FIG. 18. In a method of manufacturing the light sensor 104, the substrate 1 may be partially etched from the first surface 1a toward the second surface 1b to form a portion of a deep trench 3, and the first insulating part 6 may be formed by filling the portion of the deep trench 3 with an insulating layer. Subsequently, the back grinding process may be performed on the second surface 1b, and then, the substrate 1 may be partially etched from the second surface 1b toward the first surface 1a to form another portion of the deep trench 3. An insulating layer and a metal layer may be sequentially formed on the second surface 1b and in another portion of the deep trench 3, and a planarization etching process may be performed on the metal layer and the insulating layer to form the second reflector 7 and the second insulating part 5. In this case, the second reflector 7 may be formed of metal. The other manufacturing processes may be the same or similar as described with reference to FIGS. 10 to 15.

Figure 20:
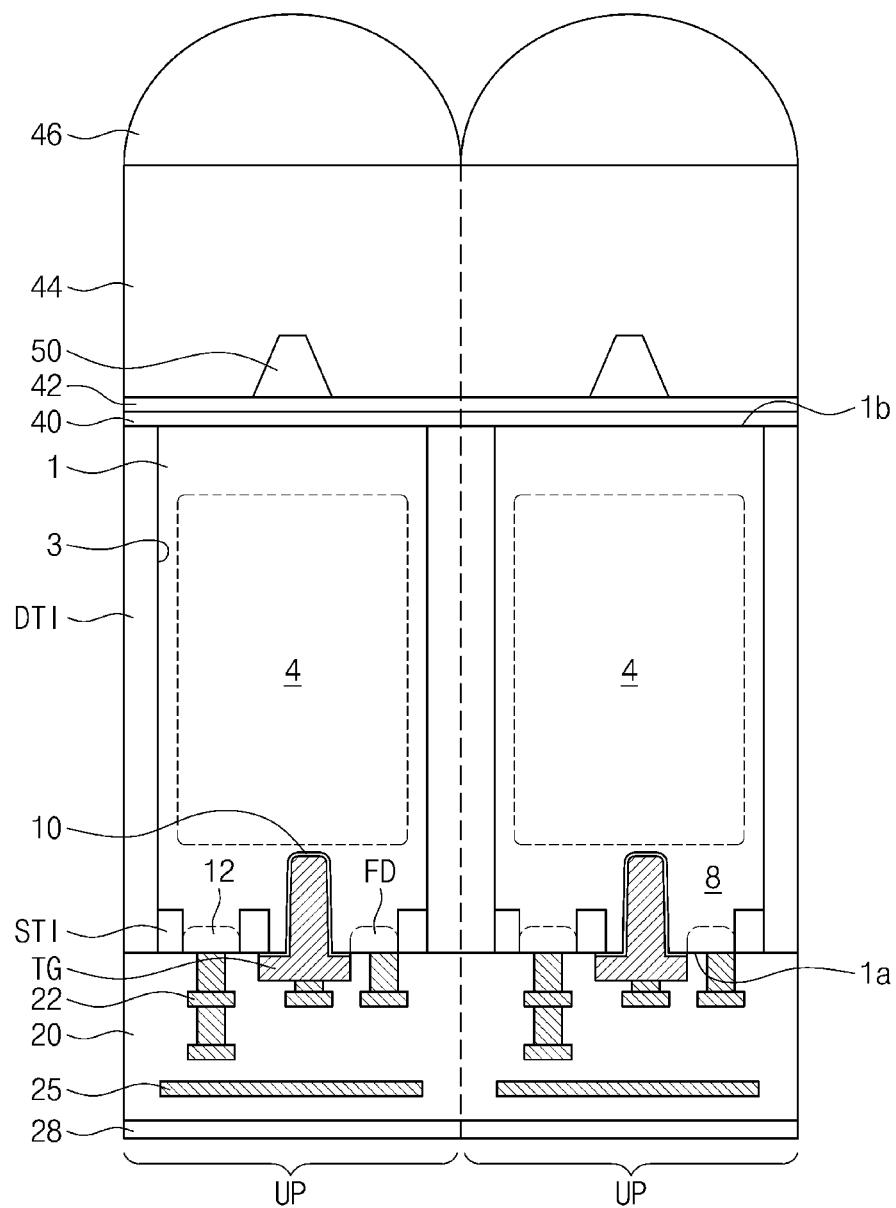
FIG. 20 is a cross-sectional view illustrating a light sensor according to an exemplary embodiment of the present inventive concept.

FIG. 20 is a cross-sectional view illustrating a light sensor according to an exemplary embodiment of the present inventive concept.

In FIG. 20, a light sensor 105 may include a light splitter 50 that is disposed on an anti-reflection layer 42. In this case, the light splitter 50 may be in contact with a planarization layer 44. For example, the light splitter 50 may be disposed between the anti-reflection layer 42 and the planarization layer 44. The light splitter 50 may include a material having a different refractive index from the substrate 1. For example, the light splitter 50 may include a material whose refractive index is higher than a refractive index of silicon. The present inventive concept is not limited thereto. For example, the light splitter 50 may include a metal oxide layer having a higher dielectric constant than a silicon oxide layer. The metal oxide layer may be referred to as a high-k dielectric oxide. For example, the metal oxide layer may include at least one of a titanium oxide layer, a hafnium oxide layer, a lanthanum oxide layer, a zirconium oxide layer, and an aluminum oxide layer. Light incident through the micro lens 46 may be scattered at an interface between the planarization layer 44 and the light splitter 50. Thus, an absorption factor of light having a long wavelength (e.g., infrared light or red light) may be increased. The other components of the light sensor 105 may be the same or similar as corresponding components of the light sensor 100 of FIG. 2.

Figure 21:
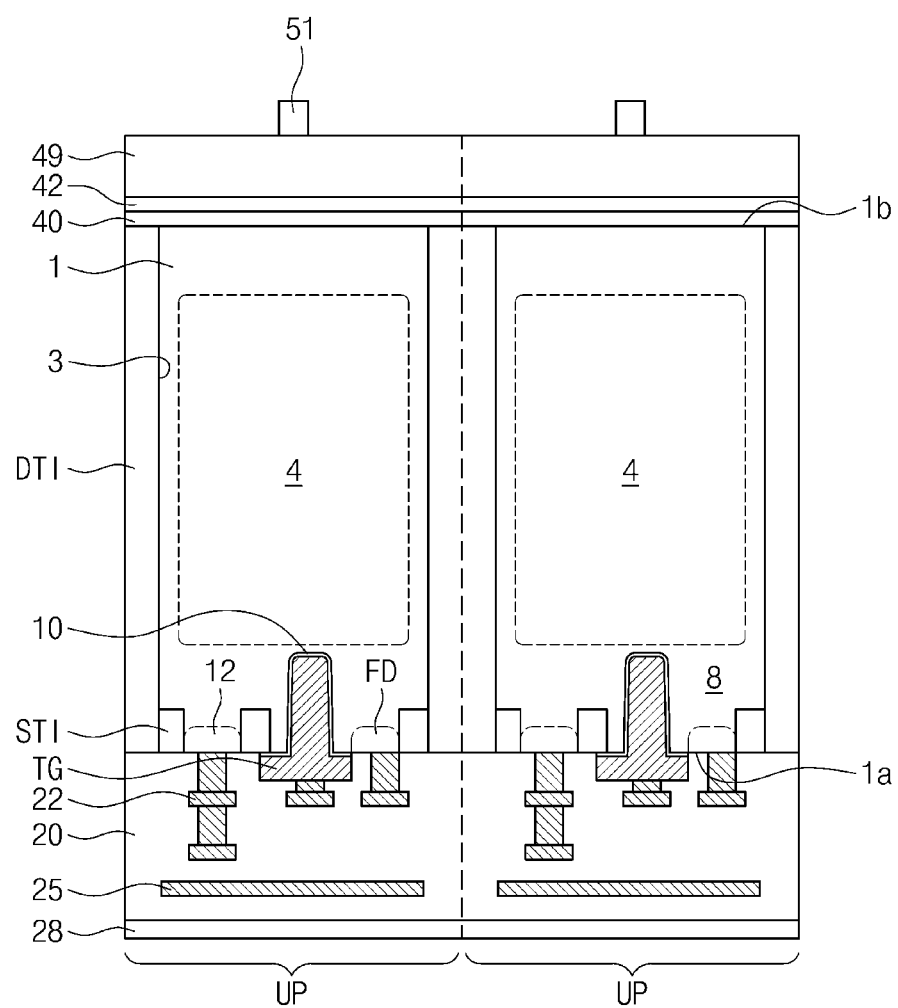
FIGS. 21 and 22 are cross-sectional views illustrating a method of manufacturing the light sensor of FIG. 20 according to an exemplary embodiment of the present inventive concept.
Figure 22:
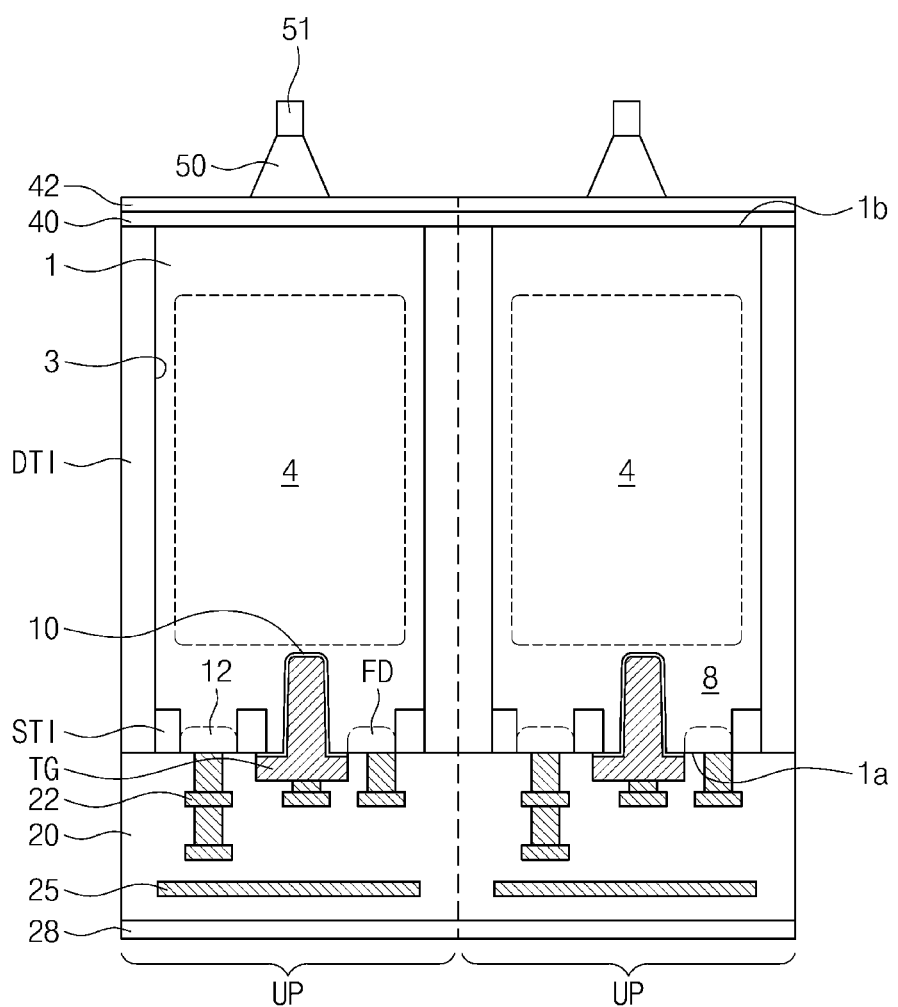

FIGS. 21 and 22 are cross-sectional views illustrating a method of manufacturing the light sensor of FIG. 20.

In FIG. 21, a fixed charge layer 40 and an anti-reflection layer 42 may be sequentially formed on the second surface 1b of the substrate 1. A high refractive index layer 49 may be formed on the anti-reflection layer 42. The high refractive index layer 49 may be formed of a material having a higher refractive index than silicon. For example, the high refractive index layer 49 may be formed of at least one of a titanium oxide layer, a hafnium oxide layer, a lanthanum oxide layer, a zirconium oxide layer, and an aluminum oxide layer. A mask pattern 51 may be formed on the high refractive index layer 49. For example, the mask pattern 51 may be formed of silicon nitride.

In FIG. 22, the high refractive index layer 49 may be patterned using the mask pattern 51 as an etch mask to form a light splitter 50 and to expose a surface of the anti-reflection layer 42.

Subsequently, referring again to FIG. 20, the mask pattern 51 may be removed, and then, a planarization layer 44 may be formed on the anti-reflection layer 42 and the light splitter 50. A micro lens 46 may be formed on the planarization layer 44.

Figure 23:
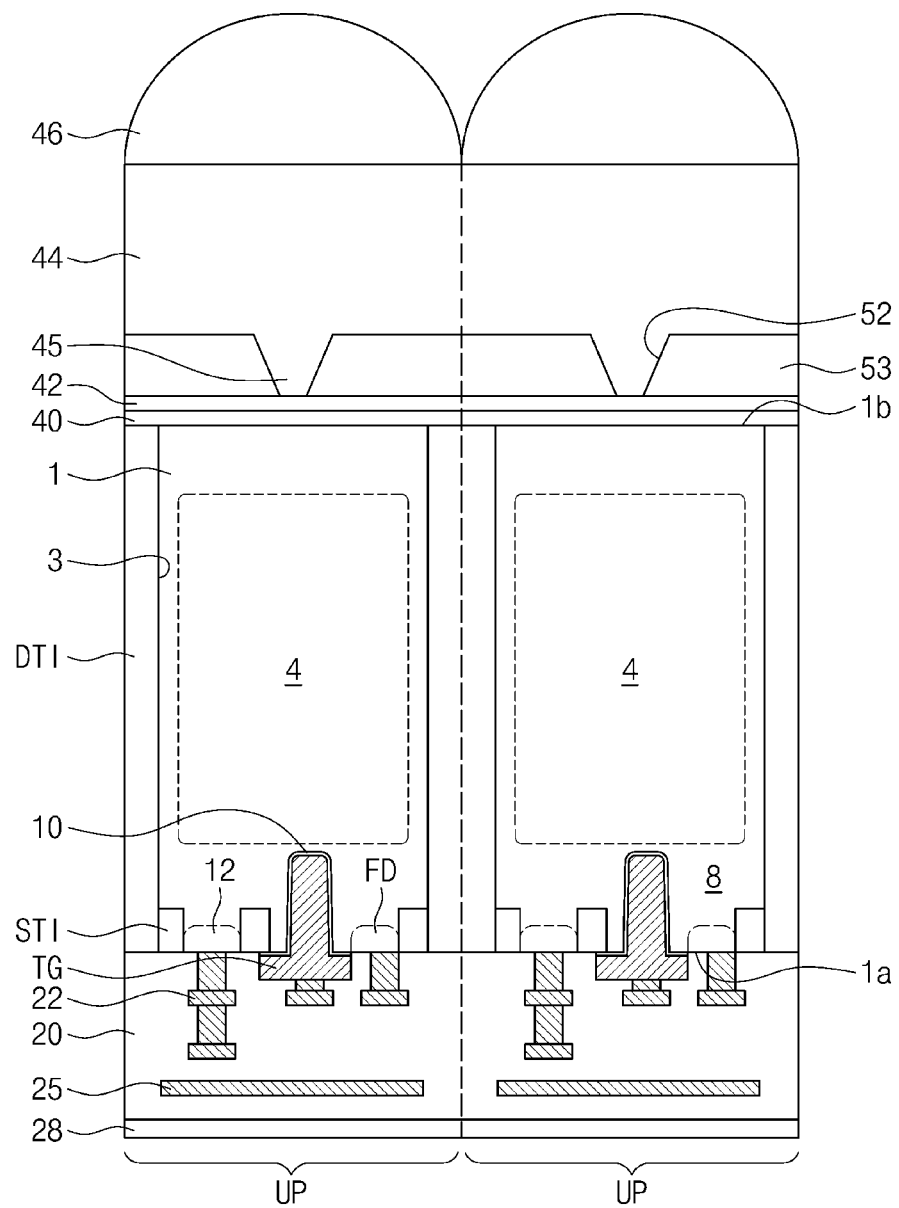
FIG. 23 is a cross-sectional view illustrating a light sensor according to an exemplary embodiment of the present inventive concept.

FIG. 23 is a cross-sectional view illustrating a light sensor according to an exemplary embodiment of the present inventive concept.

In FIG. 23, a light sensor 106 may include a light splitter 45 that may be a portion of a planarization layer 44. The portion of the planarization layer 44 may protrude toward the second surface 1b of the substrate 1. A refractive index difference part 53 may be disposed between a bottom surface of the planarization layer 44 and the anti-reflection layer 42. A hole 52 may penetrate the refractive index difference part 53, and the light splitter 45 may be disposed in the hole 52. The refractive index difference part 53 may include a material having a different refractive index from the substrate 1. For example, the refractive index difference part 53 may include a material whose refractive index is higher than that of silicon. The refractive index difference part 53 may include a metal oxide layer having a higher dielectric constant than a silicon oxide layer. For example, the refractive index difference part 53 may include at least one of a titanium oxide layer, a hafnium oxide layer, a lanthanum oxide layer, a zirconium oxide layer, and an aluminum oxide layer. The other components of the light sensor 106 may be the same or similar as corresponding components of the light sensor 105 described with reference to FIG. 20.

A method of manufacturing the light sensor 106 may be similar to the method of manufacturing the light sensor 105 of FIG. 20 using a mask pattern different from the shape of the mask pattern 51 of FIG. 21. For example, the shape of the mask pattern may be similar to the shape of the mask pattern 30 of FIG. 13 so that the mask pattern 51 may expose a portion of a preliminary refractive index difference part layer, covering a remaining portion of a preliminary refractive index difference part layer. The portion of the preliminary refractive index different part layer will be changed to the light splitter 45. Subsequently, the preliminary refractive index difference part layer may be patterned using the mask pattern as an etch mask to form the refractive index difference part 53 having the hole 52 penetrating the preliminary refractive index difference part layer. A planarization layer 44 may be formed on the refractive index difference part 53 to fill the hole 52, and thus the light splitter 45 may be formed in the hole 52. The other manufacturing processes may be the same or similar as described with reference to FIGS. 21 and 22.

Figure 24:
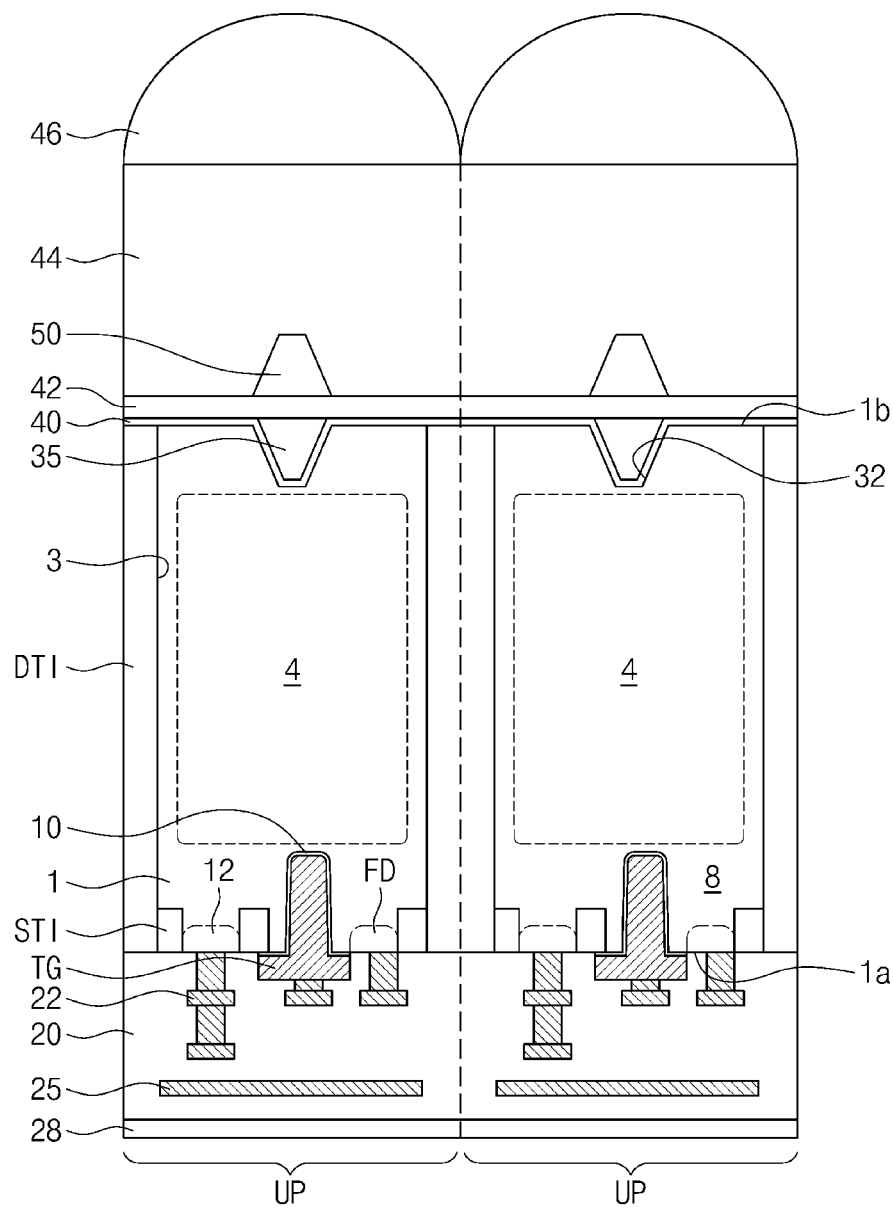
FIG. 24 is a cross-sectional view illustrating a light sensor according to an exemplary embodiment of the present inventive concept.

FIG. 24 is a cross-sectional view illustrating a light sensor according to an exemplary embodiment of the present inventive concept.

In FIG. 24, a light sensor 107 may include a first light splitter 35 and a second light splitter 50 disposed on opposite sides of an anti-reflection layer 42. The first light splitter 35 may correspond to the light splitter 35 of FIG. 2. The second light splitter 50 may correspond to the light splitter 50 of FIG. 20. The first light splitter 35 may include a material having a lower refractive index than silicon. The second light splitter 50 may include a material having a higher refractive index than silicon. The present inventive concept is not limited thereto. For example, the first and second light splitters 35 and 50 may be formed of the same material. The first light splitter 35 and the second light splitter 50 may vertically overlap each other. The components of the light sensor 107 may be the same or similar as corresponding components of the light sensors 100 and 105 described with reference to FIGS. 2 and 20. The first light splitter 35 may be formed by the same method as described with reference to FIGS. 13 to 15. The second light splitter 50 may be formed by the same method as described with reference to FIGS. 21 and 22.

Figure 25:
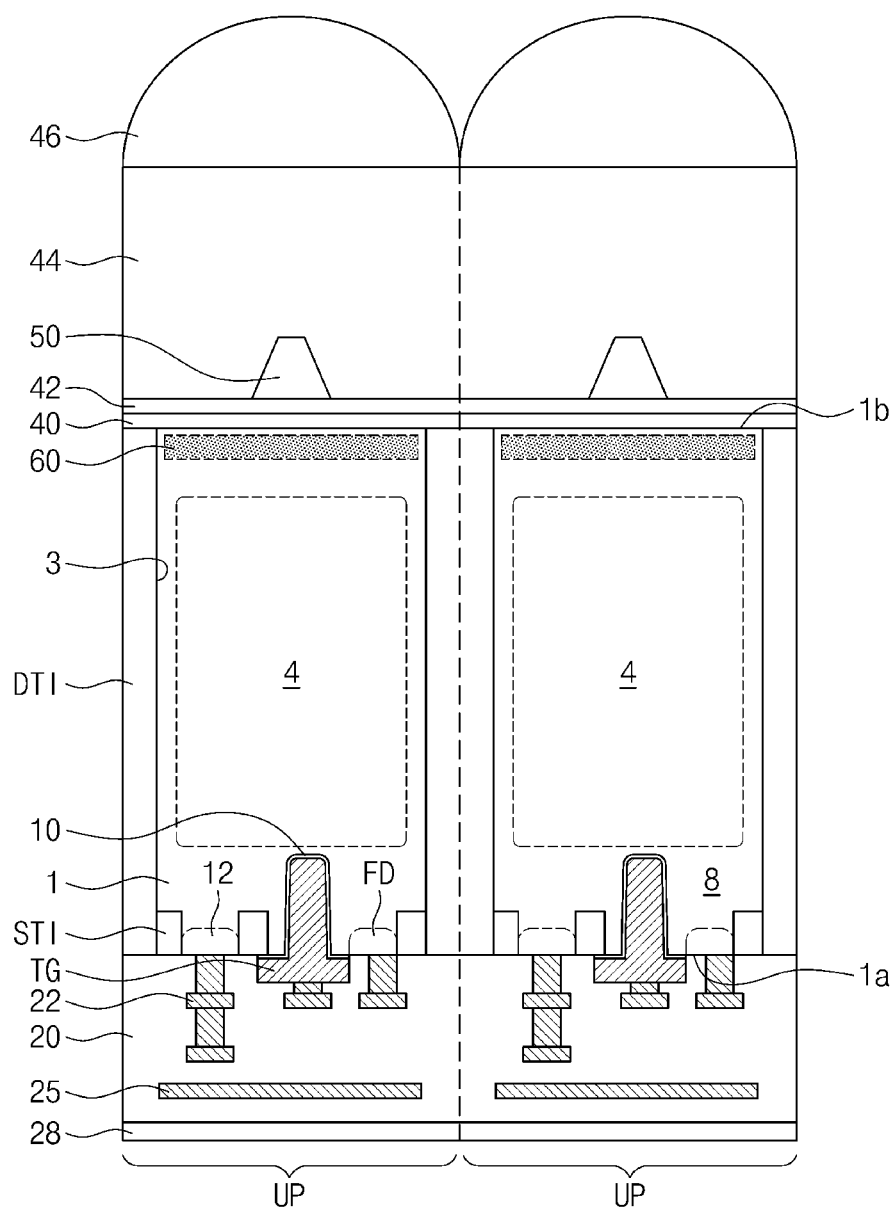
FIG. 25 is a cross-sectional view illustrating a light sensor according to an exemplary embodiment of the present inventive concept.

FIG. 25 is a cross-sectional view illustrating a light sensor according to an exemplary embodiment of the present inventive concept.

In FIG. 25, a light sensor 108 may include a third impurity injection region 60 disposed in the substrate 1 close to the second surface 1b. The third impurity injection region 60 may be doped with, for example, germanium (Ge). In this case, the third impurity injection region 60 may increase the photoelectric conversion efficiency of the photoelectric converter including the first impurity injection region 8 and the second impurity injection region 4 due to an energy band gap of germanium smaller than an energy band gap of silicon. A small amount of light incident may generate electron-hole pairs with the addition of the third impurity injection region 60. In an exemplary embodiment, the third impurity injection region 60 may be doped with a chalcogen element (i.e., a group 16 element) such as sulfur (S), selenium (Se), and tellurium (Te), or a metal element such as lead (Pb), titanium (Ti), tantalum (Ta), tungsten (W), and nickel (Ni). In this case, a defect level may be formed in the energy band gap of silicon, and thus the photoelectric conversion efficiency may be increased.

In a method of manufacturing the light sensor 108, an ion implantation process may be performed in the step of FIG. 12 to form the third impurity injection region 60. The other manufacturing processes may be the same or similar as described with reference to FIGS. 20 to 22.

Figure 26:
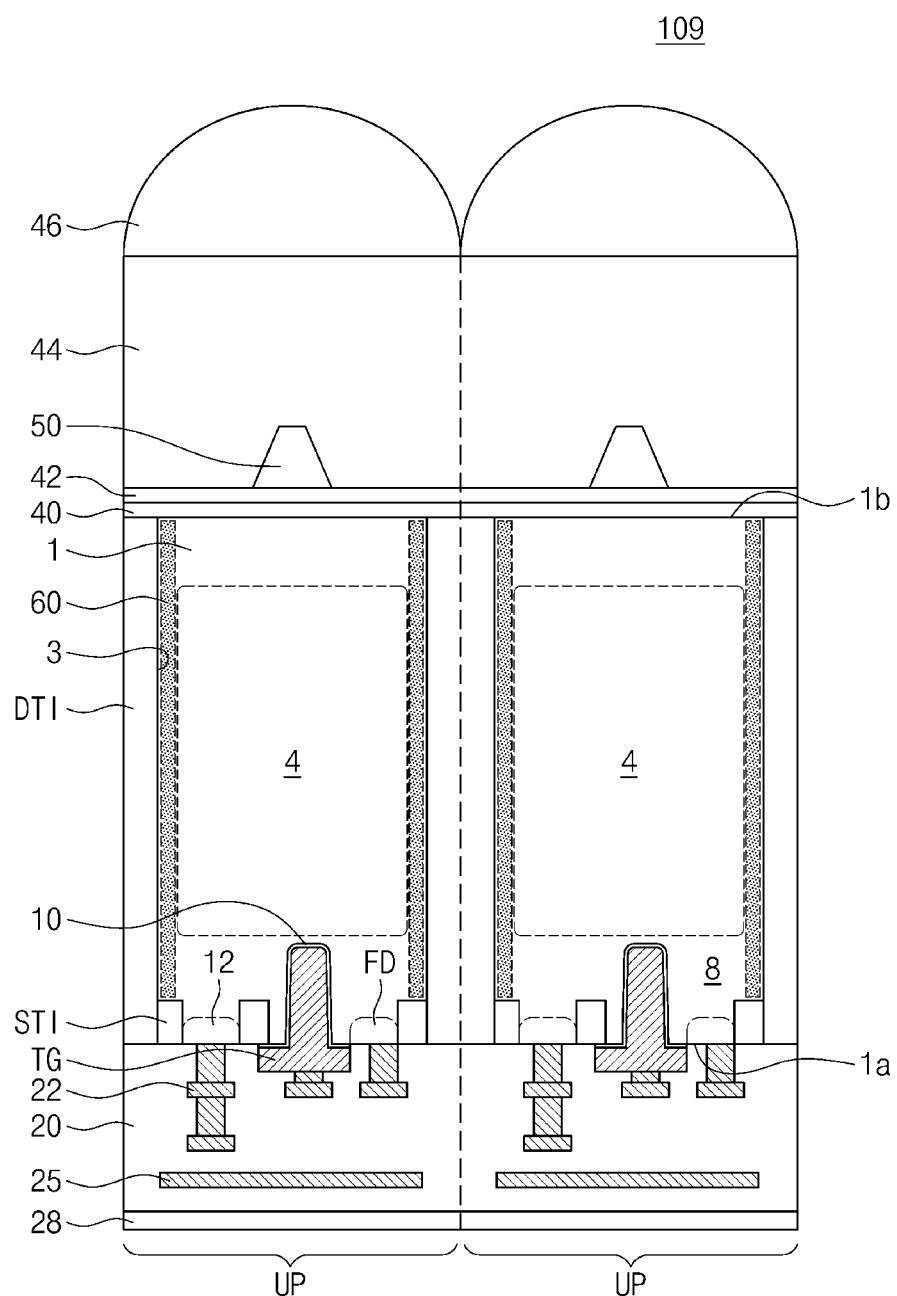
FIG. 26 is a cross-sectional view illustrating a light sensor according to an exemplary embodiment of the present inventive concept.

FIG. 26 is a cross-sectional view illustrating a light sensor according to an exemplary embodiment of the present inventive concept.

In FIG. 26, a light sensor 109 may include a third impurity injection region 60 that is disposed adjacent to a deep trench isolation structure DTI in a substrate 1. The third impurity injection region 60 may be disposed along a sidewall of the deep trench isolation structure DTI. In an exemplary embodiment, the third impurity injection region 60 may be disposed between the sidewall of the deep trench isolation structure DTI and a photoelectric converter including a first impurity injection region 8 and a second impurity injection region 4.

The other components of the light sensor 109 may be the same or similar as corresponding components of the light sensor 108 described with reference to FIG. 25. In a method of manufacturing the light sensor 109, a tilt ion implantation process may be performed to form the third impurity injection region 60 after the substrate 1 is etched to form the deep trench 3 in the step of FIG. 10. The other manufacturing processes may be the same or similar as described with reference to FIGS. 20 to 22.

Figure 27:
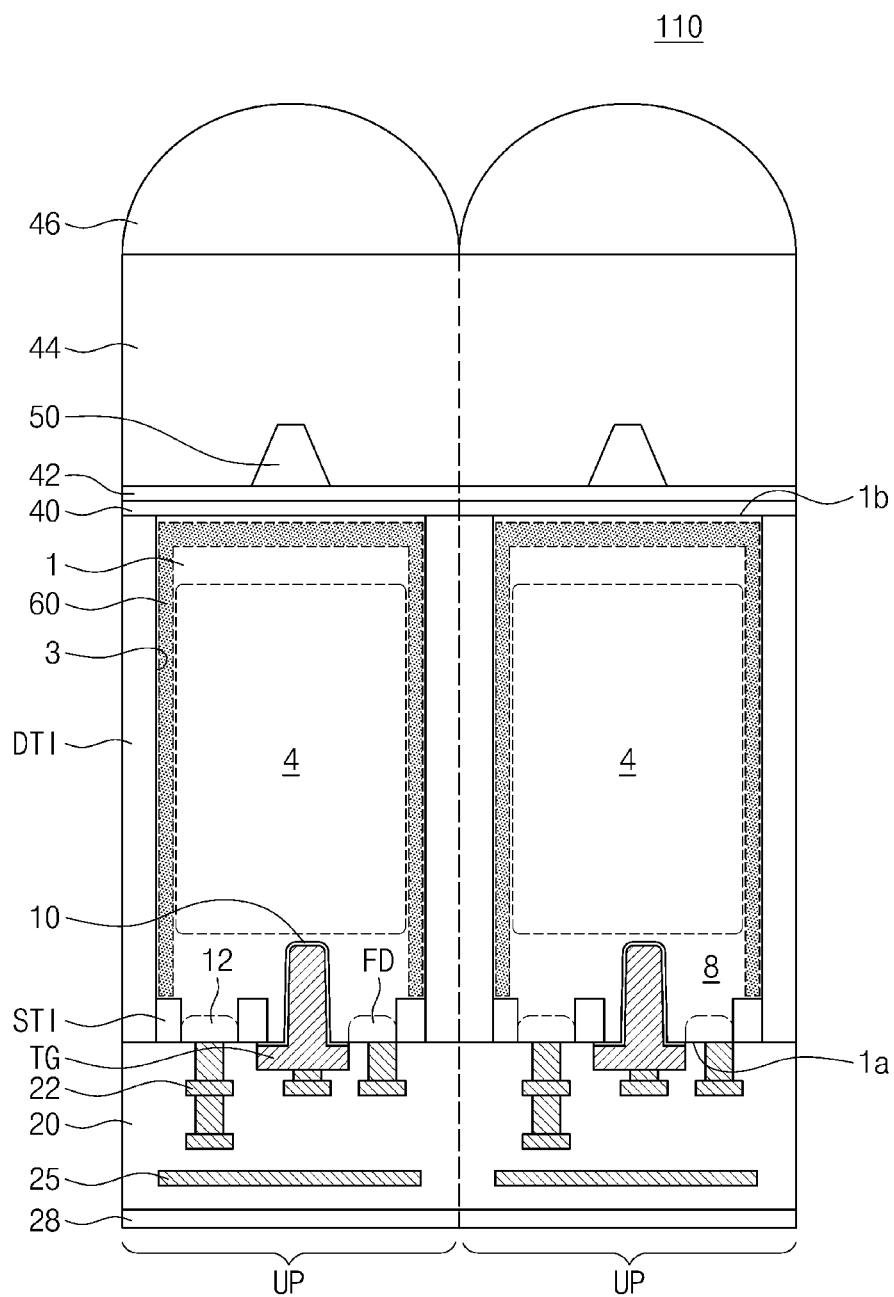
FIG. 27 is a cross-sectional view illustrating a light sensor according to an exemplary embodiment of the present inventive concept.

FIG. 27 is a cross-sectional view illustrating a light sensor according to an exemplary embodiment of the present inventive concept.

In FIG. 27, a light sensor 110 may include a third impurity injection region 60 that may be formed in a region adjacent to the second surface 1b and along the sidewall of the deep trench isolation structure DTI in the substrate 1. The third impurity injection region 60 may be formed by tilt ion implantation after the formation of the deep trench 3 and by ion implantation after the back grinding process on the second surface 1b. The other components and other manufacturing processes may be the same or similar as described with reference to FIGS. 20 to 22 and 26.

Figure 28:
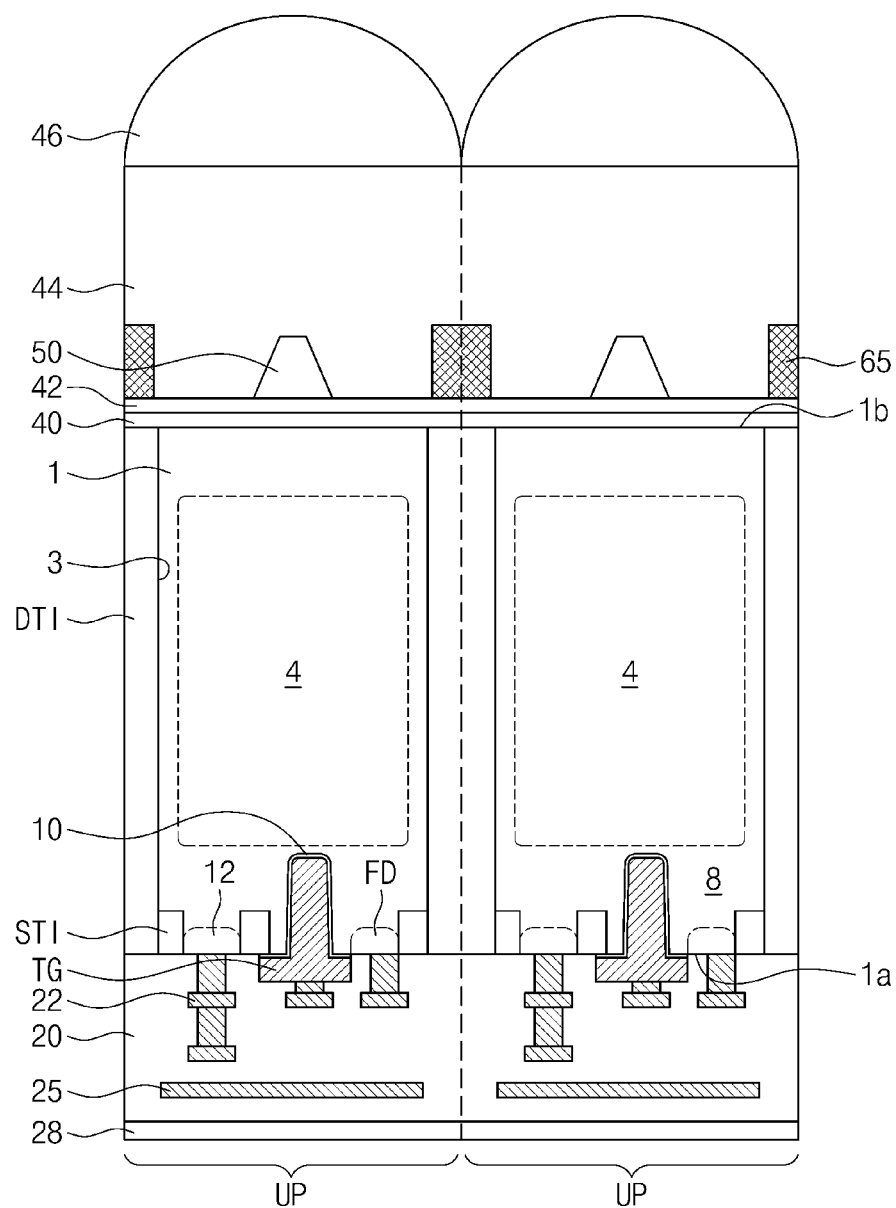
FIG. 28 is a cross-sectional view illustrating a light sensor according to an exemplary embodiment of the present inventive concept.

FIG. 28 is a cross-sectional view illustrating a light sensor according to an exemplary embodiment of the present inventive concept.

In FIG. 28, a light sensor 111 may include a light-shielding pattern 65 disposed on the anti-reflection layer 42. The light-shielding pattern 65 may be formed of a metal such as tungsten and may have a grid shape. The light-shielding pattern 65 may prevent crosstalk between neighboring unit pixel regions UP. The other components of the light sensor 111 may be the same or similar as corresponding components of the light sensor 105 described with reference to FIG. 20.

Figure 29:
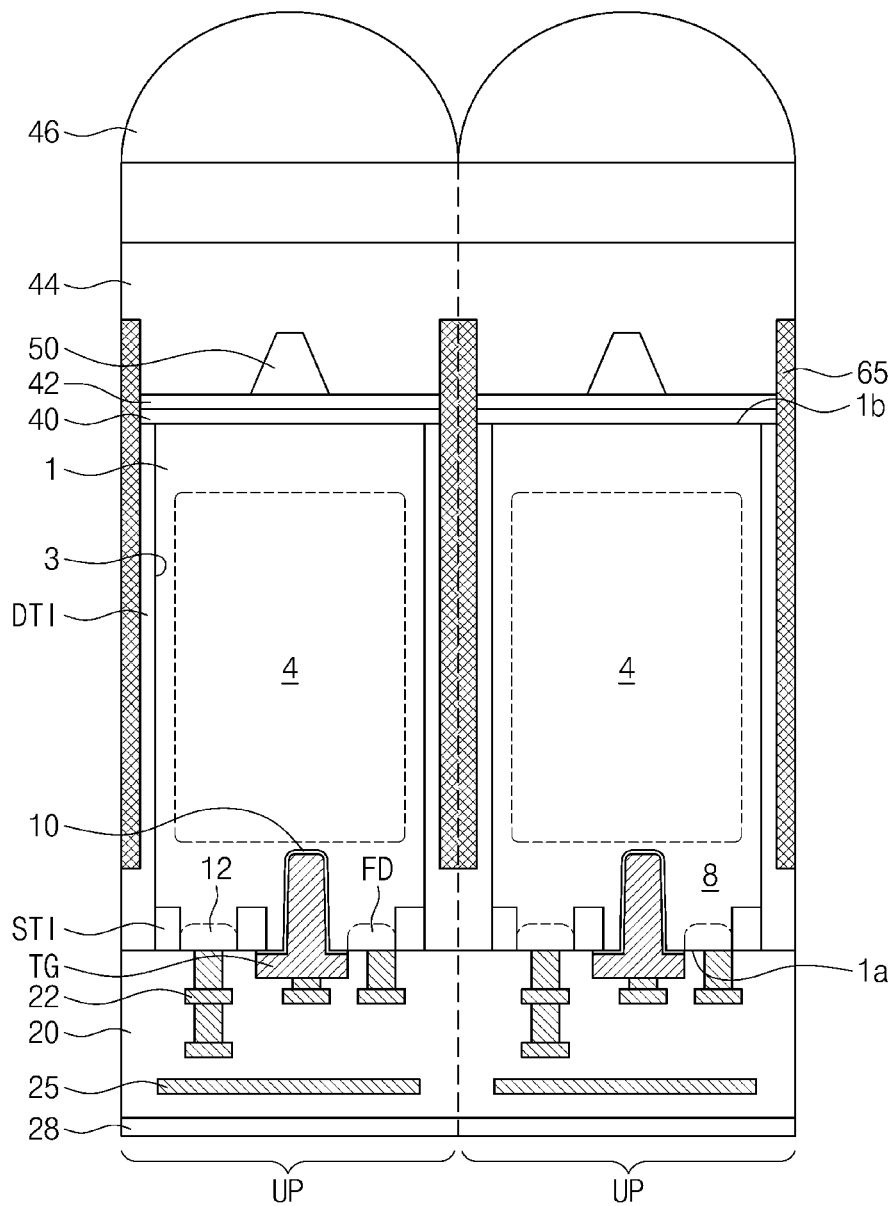
FIG. 29 is a cross-sectional view illustrating a light sensor according to an exemplary embodiment of the present inventive concept.

FIG. 29 is a partial cross-sectional view illustrating a light sensor according to an exemplary embodiment of the present inventive concept.

In FIG. 29, a light sensor 112 may include a light-shielding pattern 65 that penetrates the anti-reflection layer 42 and the fixed charge layer 40 into the deep trench isolation structure DTI. In this case, a bottom surface of the light-shielding pattern 65 may be in contact with the deep trench isolation structure DTI and a portion of the light-shielding pattern 65 may be surrounded by the deep trench isolation structure DTI. The other components of the light sensor 112 may be the same or similar as corresponding components of the light sensor 111 of FIG. 28.

Figure 30:
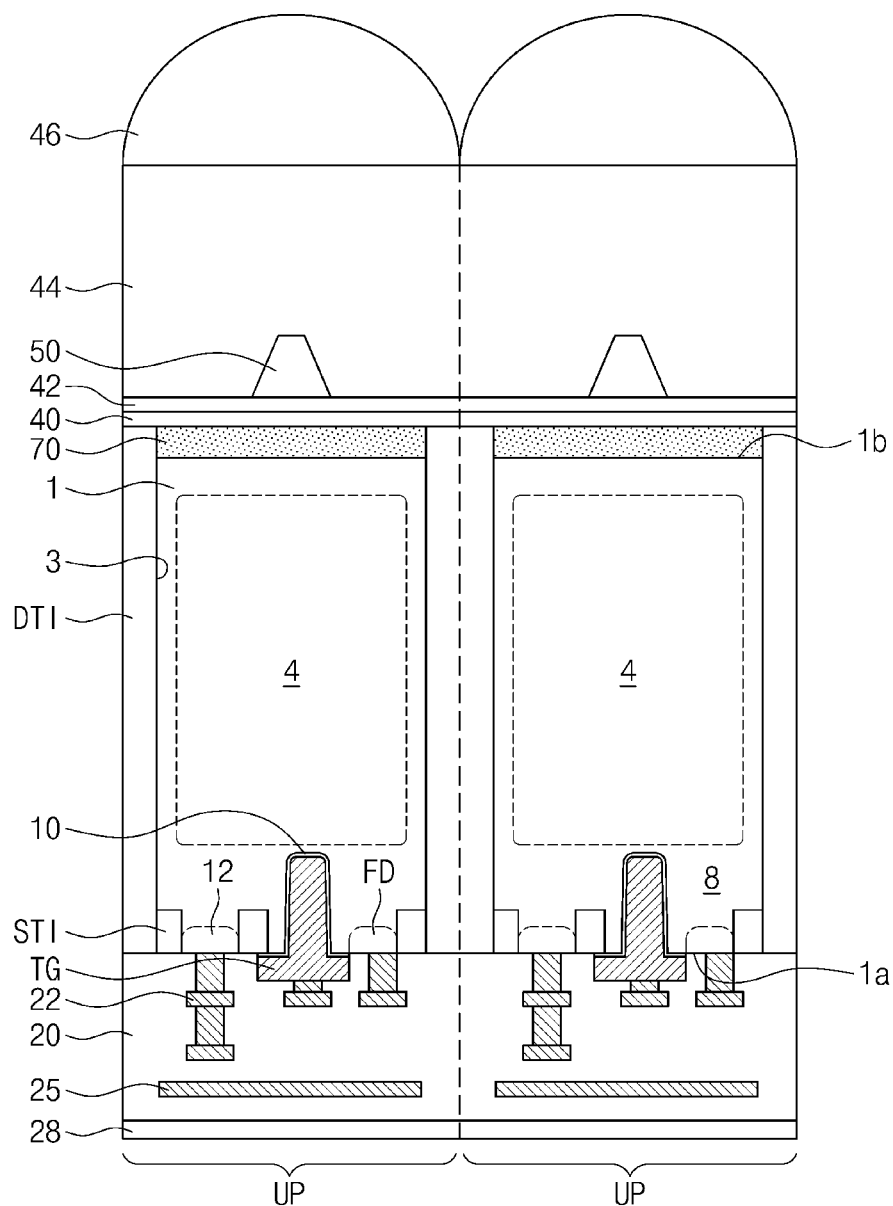
FIG. 30 is a cross-sectional view illustrating a light sensor according to an exemplary embodiment of the present inventive concept.

FIG. 30 is a partial cross-sectional view illustrating a light sensor according to an exemplary embodiment of the present inventive concept.

In FIG. 30, a light sensor 113 may include an amorphous structure 70 that may be disposed adjacent to the second surface 1b of the substrate 1. The amorphous structure 70 may be an amorphous layer disposed on the second surface 1b of the substrate 1. In this case, the second surface 1b may be lower than a top surface of the deep trench isolation structure DTI. In an exemplary embodiment, the amorphous structure 70 may include amorphous silicon.

In an exemplary embodiment, the amorphous structure 70 may be formed by amorphization of a portion of the substrate 1. The energy band gap of silicon in the substrate 1 may be reduced by the amorphous structure 70. Thus, the photoelectric conversion efficiency of the photoelectric converter including the first impurity injection region 8 and the second impurity injection region 4 may be increased. For example, a laser may be irradiated on a portion of the substrate 1 to make single-crystalline silicon of the substrate 1 unstable, and then, an annealing process may be performed on the unstable single-crystalline silicon of the substrate 1 to amorphize the portion of the substrate 1. In an exemplary embodiment, the annealing process may be performed in an ambient of hydrogen gas.

The present inventive concept is not limited thereto. For example, the amorphous layer may be deposited on the second surface 1b using a plasma-enhanced chemical vapor deposition (PECVD) method or an inductively-coupled-plasma chemical vapor deposition (ICP CVD) method.

The other components and other manufacturing processes may be the same or similar as described with reference to FIGS. 20 to 22.

Figure 31:
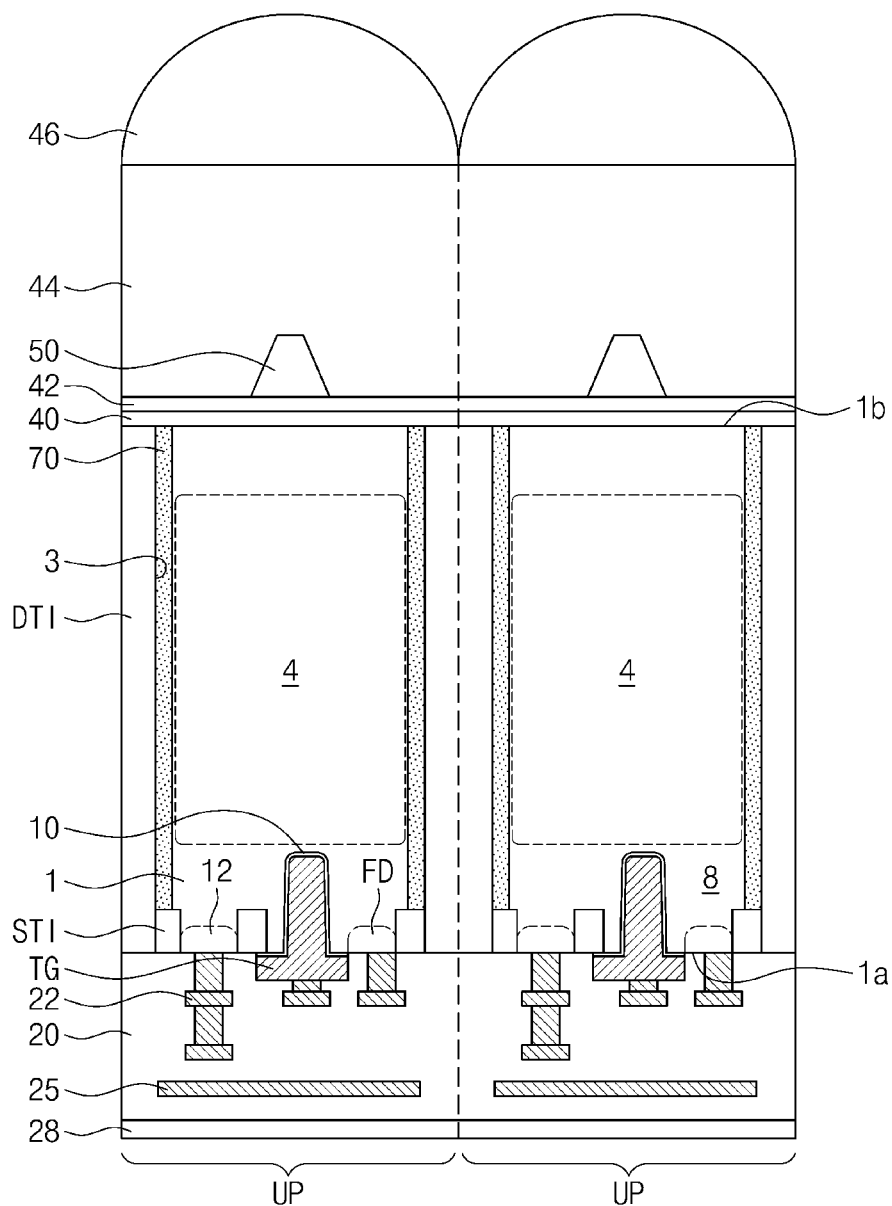
FIG. 31 is a cross-sectional view illustrating a light sensor according to an exemplary embodiment of the present inventive concept.

FIG. 31 is a cross-sectional view illustrating a light sensor according to an exemplary embodiment of the present inventive concept.

In FIG. 31, a light sensor 114 may include an amorphous structure 70 that may be disposed adjacent to the deep trench isolation structure DTI in the substrate 1. After the formation of the deep trench 3, the amorphous structure 70 may be formed by amorphization of a portion of the substrate 1 in the deep trench 3 or by depositing an amorphous layer on the inner wall of the deep trench 3. The other components and other manufacturing processes may be the same or similar as described with reference to FIG. 30.

Figure 32:
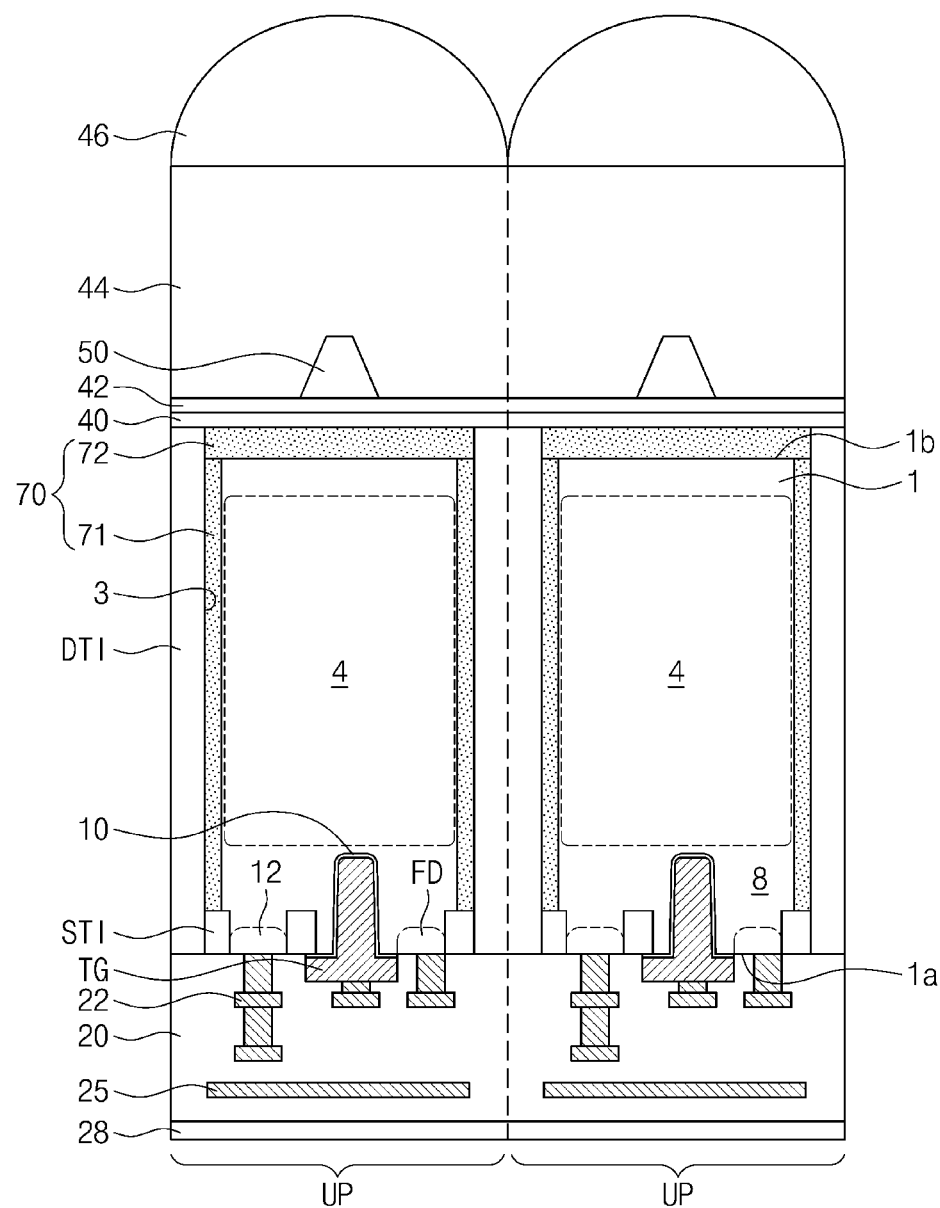
FIG. 32 is a cross-sectional view illustrating a light sensor according to an exemplary embodiment of the present inventive concept.

FIG. 32 is a cross-sectional view illustrating a light sensor according to an exemplary embodiment of the present inventive concept.

In FIG. 32, a light sensor 115 may include an amorphous structure 70 having a first amorphous structure 71 disposed along the sidewall of the deep trench isolation structure DTI and a second amorphous structure 72 disposed adjacent to the second surface 1b of the substrate 1. The other components and other manufacturing processes may be the same or similar as described with reference to FIGS. 30 and 31.

Figure 33:
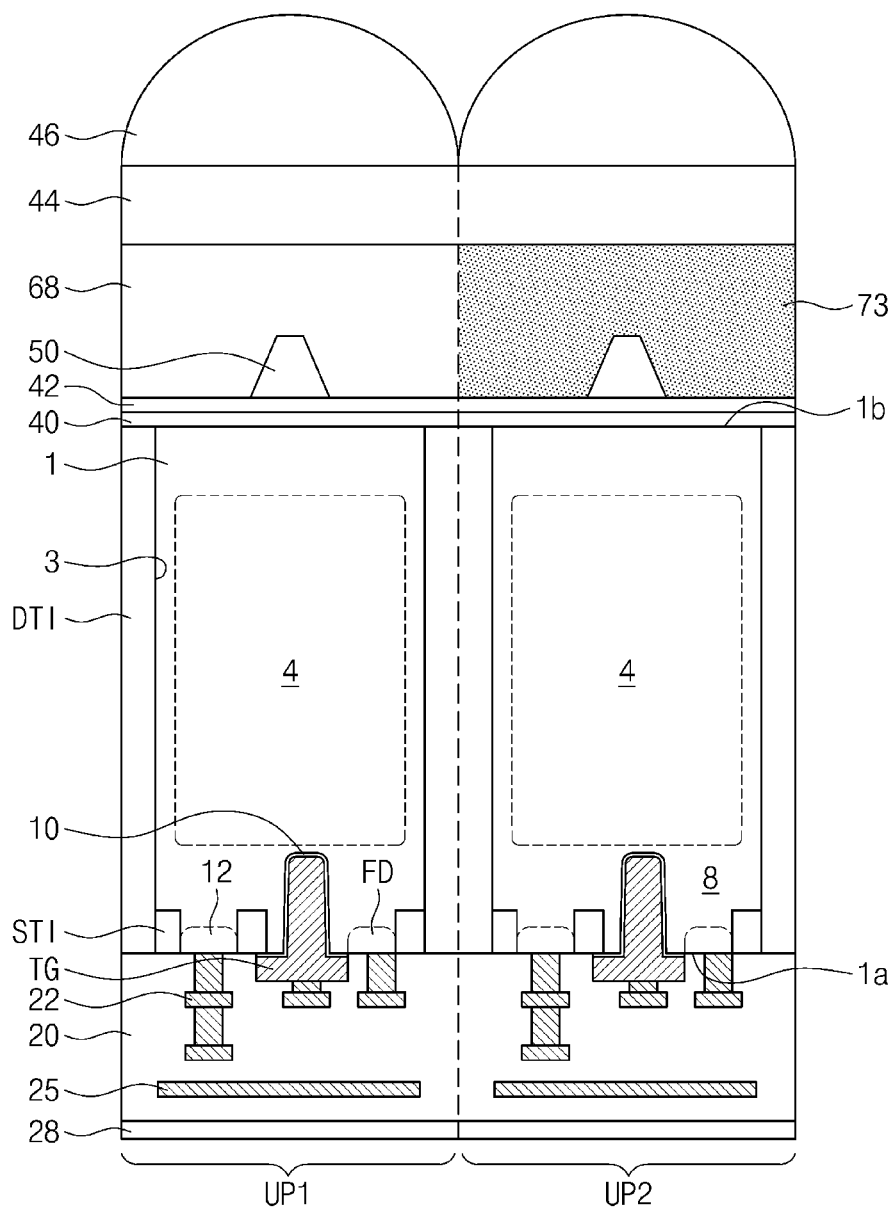
FIG. 33 is a cross-sectional view illustrating a light sensor according to an exemplary embodiment of the present inventive concept.

FIG. 33 is a cross-sectional view illustrating a light sensor according to an exemplary embodiment of the present inventive concept.

In FIG. 33, a light sensor 116 may include a first unit pixel region UP1 and a second unit pixel region UP2. A first filter 68 may be disposed on the anti-reflection layer 42 of the first unit pixel region UP1. A second filter 73 may be disposed on the anti-reflection layer 42 of the second unit pixel region UP2. A planarization layer 44 may be disposed on the first filter 68 and the second filter 73. In an exemplary embodiment, the first filter 68 and the second filter 73 may be color filters. In an exemplary embodiment, the first filter 68 may be a white filter without pigment. The second filter 73 may be a color filter with a color pigment added, to filter a specific color such as such as a red color, a blue color, and a green color.

In an exemplary embodiment, an infrared filter exists between the lens 1001 and the light sensor 1003 in the image processing device 1000 of FIG. 1, and thus only infrared light may be incident through the micro lens 46. In this case, the infrared light may pass through both the first filter 68 and the second filter 73.

The present inventive concept is not limited thereto. For example, the infrared filter need not exist between the lens 1001 and the light sensor 1003 in the image processing device 1000 of FIG. 1. In this case, visible light may be incident through the micro lens 46. As a result, a filtering may be performed within the light sensor 116. For example, the first filter 68 may be an infrared filter, and the second filter 73 may be a color filter into which a pigment is added. Only infrared light may be incident into the substrate 1 by the first filter 68 in the first unit pixel region UP1. Only visible light having a specific wavelength may be incident into the substrate 1 by the second filter 73 in the second unit pixel region UP2. The second unit pixel region UP2 may also increase the absorption factor of visible light by the light splitter 50.

The various light sensors according to exemplary embodiments of the present inventive concept have been described with reference to the drawings. The various structures and the various manufacturing methods described above may be combined in various forms.

Figure 34:
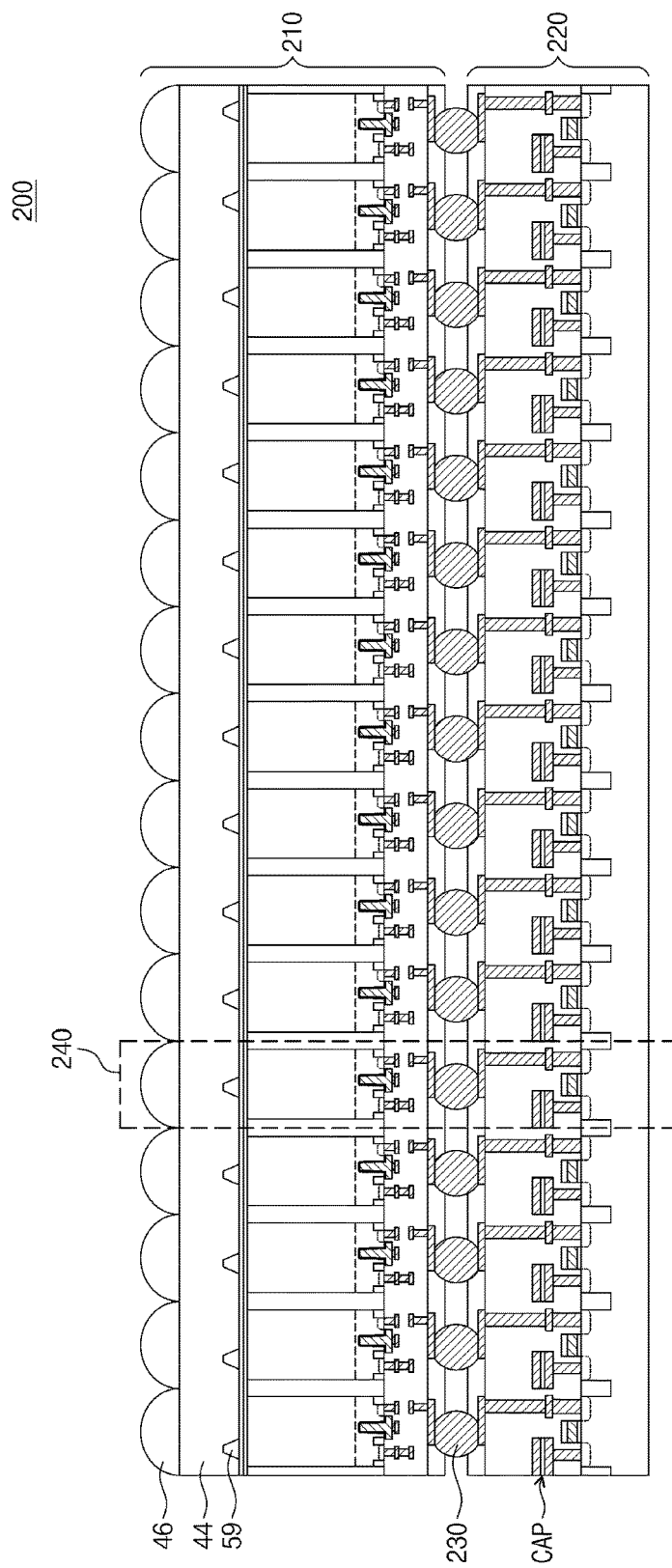
FIG. 34 is a cross-sectional view illustrating a light sensor according to an exemplary embodiment of the present inventive concept.
Figure 35:
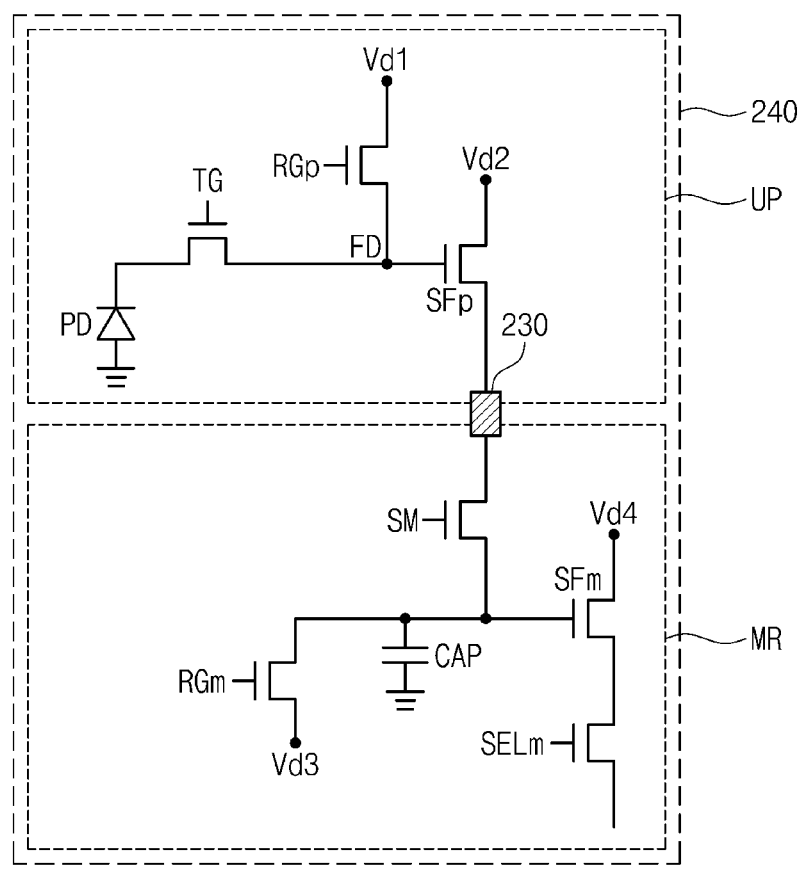
FIGS. 35 and 36 are circuit diagrams illustrating light sensors according to an exemplary embodiment of the present inventive concept.
Figure 36:
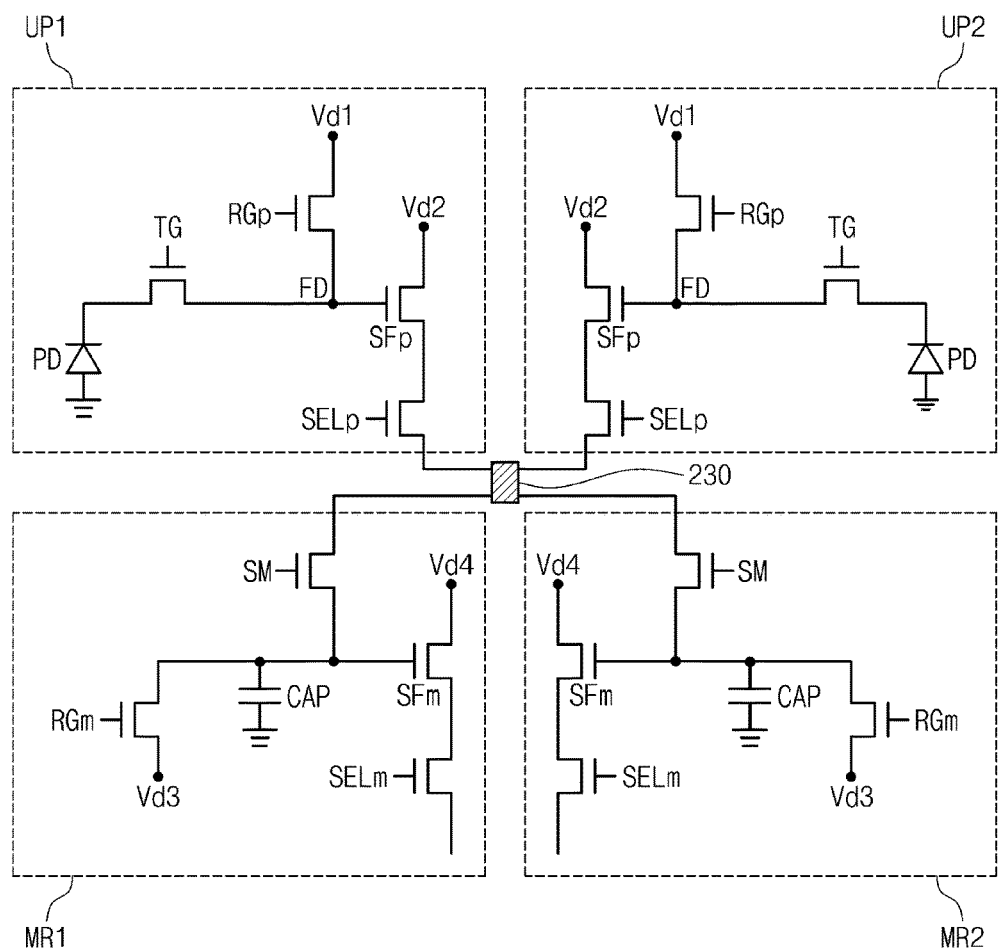

FIG. 34 is a cross-sectional view illustrating a light sensor according to an exemplary embodiment of the present inventive concept. FIGS. 35 and 36 are circuit diagrams illustrating portions of light sensors according to exemplary embodiments of the present inventive concept.

In FIGS. 34 and 35, a light sensor 200 may include a pixel substrate 210 and a memory substrate 220 which are electrically connected to each other. For example, the pixel substrate 210 may be electrically connected to the memory substrate 220 through a connection member 230. The connection member 230 may be, for example, a solder bump, and the pixel substrate 210 may be connected to the memory substrate 220 by a flip chip bonding method. However, the present inventive concept is not limited thereto. For example, the pixel substrate 210 may be electrically connected to the memory substrate 220 by a wire. In an exemplary embodiment, a through-via may electrically connect the pixel substrate 210 to the memory substrate 220. In an exemplary embodiment, the pixel substrate 210 and the memory substrate 220 may be connected to each other by a hybrid bonding technique using a copper-copper (Cu-Cu) bonding technique.

In an exemplary embodiment, the pixel substrate 210 may be the same or similar as described with reference to FIGS. 1 to 33. The pixel substrate 210 may include a plurality of unit pixel regions UP. The memory substrate 220 may include a plurality of unit memory regions MR electrically connected to the plurality of unit pixel regions UP. Each of the plurality of unit memory regions MR may include a capacitor CAP. A unit pixel region UP and unit memory region MR may combine to form a unit pixel 240. The pixel substrate 210 may be referred to as a first substrate. The memory substrate 220 may be referred to as a second substrate.

A circuit operation of the unit pixel region UP and the unit memory region MR will be described with reference to FIG. 35.

In FIG. 35, each of the plurality of unit pixel regions UP may include a transfer transistor TG, a pixel source follower transistor SFp, and a pixel reset transistor RGp. A first source/drain of the transfer transistor TG may be connected to a photodiode PD, and a second source/drain of the transfer transistor TG may be connected to a floating diffusion region FD. Each of the unit memory regions MR may include a sampling transistor SM, a memory reset transistor RGm, the capacitor CAP, a memory source follower transistor SFm, and a memory selection transistor SELm.

The pixel reset transistor RGp may be disposed between a first power source Vd1 and the floating diffusion region FD. The pixel source follower transistor SFp may be disposed between a second power source Vd2 and the connection member 230. The memory reset transistor RGm may be disposed between a third power source Vd3 and an electrode of the capacitor CAP. The memory source follower transistor SFm may be disposed between a fourth power source Vd4 and a source/drain of the memory selection transistor SELm.

When light is incident on the photodiode PD of the unit pixel region UP through the micro lens 46, electron-hole pairs (EHPs) may be generated in proportion to energy of absorbed light. The transfer transistor TG may be turned-on to transfer charges generated from the photodiode PD to the floating diffusion region FD. Thus, the pixel source follower transistor SFp may be turned-on to transmit the charges to the unit memory region MR through the connection member 230 (e.g., a solder bump). The sampling transistor SM may be turned-on to store the charges generated in the unit pixel region UP. Thus, the charges may be stored in the capacitor CAP. The memory selection transistor SELm may be turned-on to sense the charges stored in the capacitor CAP. In FIG. 35, one unit pixel region UP is electrically connected to one unit memory region MR.

In FIG. 36, two unit pixel regions UP1 and UP2 are electrically connected to two unit memory regions MR1 and MR2 through one connection member 230. A predetermined number of the unit pixel regions UP1 and UP2 connected to the one connection member 230 may range from 1 to 64. In this case, a distance between two adjacent connection members 230 may be increased to increase a margin of a process for connecting fine unit pixel regions. Each of the unit pixel regions UP1 and UP2 may further include a pixel selection transistor SELp. With the control of the pixel selection transistor SELp and the sampling transistor SM, one of the unit pixel regions UP1 and UP2 may be selectively turned-on, and one of the unit memory regions MR1 and MR2 may be turned-on. Thus, charges generated in one of the unit pixel regions UP1 and UP2 may be stored in the one of the unit memory regions MR1 and MR2.

As described above, the light sensor 200 of FIG. 34 may further include the memory substrate 220. Thus, the light sensor 200 may operate in a global shutter mode. In an exemplary embodiment, the light sensor 200 may operate in a wide dynamic range (WDR) mode. The light sensor 200 may further include an additional circuit for operating in the global shutter mode or the WDR mode.

Figure 37:
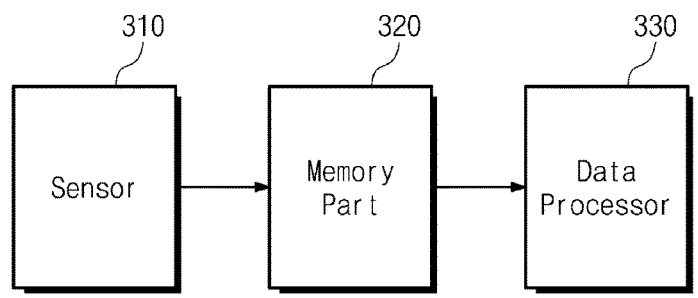
FIG. 37 is a schematic block diagram illustrating a light sensor according to an exemplary embodiment of the present inventive concept.

FIG. 37 is a schematic block diagram illustrating a light sensor according to an exemplary embodiment of the present inventive concept.

In FIG. 37, a light sensor 300 may include a sensor 310 formed in the pixel substrate 210 of FIG. 34, a memory part 320 formed in the memory substrate 220 of FIG. 34, and a data processor 330 processing electrical signals stored in the memory part 320. For example, the electrical signals may correspond to image data. In an exemplary embodiment, the data processor 330 may be formed in the memory substrate 220 of FIG. 34.

In a global shutter mode, electrical signals (image data) generated in all of unit pixel regions UP of the sensor 310 of the light sensor 300 may be stored in the memory part 320 at the same time. The data processor 330 may sequentially sense the data stored in the memory part 320 in the unit of row. Thus, the global shutter mode may be realized.

In a wide dynamic range (WDR) mode, the sensor 310 may receive light for a first time to generate charges and may store the generated charges in the memory part 320. In addition, the sensor 310 may receive light again for a second time to generate charges and may store the generated charges in the memory part 320. The first time may be longer than the second time. The data processor 330 may check and synthesize a correlation between the data generated for the first time and the data generated for the second time. Thus, high-quality image data may be outputted.

In the light sensor according to an exemplary embodiment of the present inventive concept, the light splitter may be disposed at the focal point of a micro lens to scatter light so that the multiple reflections occur to increase the light path within the sensor, and thus the absorption factor may be increased. Thus, the quantum efficiency may increase. As a result, it is possible to increase the sensing sensitivity of infrared light which is less absorbed in the light sensor compared to a visible light.

In an exemplary embodiment of the present inventive concept, a light sensor may include a photoelectric-conversion-enhancing layer that serves to increase the photoelectric conversion efficiency of the photoelectric converter. The photoelectric converter may include the first impurity injection region 8 and the second impurity injection region 4. For example, the amorphous structure 70 of FIGS. 30-32 or the third impurity injection region 60 of FIGS. 25-27 may serve as the photoelectric-conversion-enhancing layer. The amorphous structure may be formed of an amorphous silicon layer.

For example, the third impurity injection region 60 may be doped with impurities of at least one of germanium (Ge), sulfur (S), selenium (Se), tellurium (Te), lead (Pb), titanium (Ti), tantalum (Ta), tungsten (W), and nickel (Ni).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A light sensor comprising:
a first substrate including a plurality of unit pixel regions;
a deep trench isolation structure disposed in the first substrate, the deep trench isolation structure isolating each of the plurality of unit pixel regions from each other;
a plurality of photoelectric converters, each of the plurality of photoelectric converters being disposed in one of the plurality of unit pixel regions;
a plurality of micro lenses disposed on the first substrate;
a plurality of light splitters disposed on the first substrate, each of the plurality of light splitters being disposed between one of the plurality of micro lenses and one of the plurality of photoelectric converters; and
a plurality of photoelectric-conversion-enhancing layers, each of the plurality of photoelectric-conversion-enhancing layers is disposed between one of the plurality of light splitters and one of the plurality of photoelectric converters.

2. The light sensor of claim 1, further comprising:
a fixed charge layer in contact with the first substrate between each of the plurality of photoelectric converters and each of the plurality of micro lenses.

3. The light sensor of claim 1, further comprising:
a plurality of vertical-type gates disposed on the first substrate, each of the plurality of vertical-type gates extending from a surface of the first substrate into the first substrate in one of the plurality of unit pixel regions.

4. The light sensor of claim 1,
wherein each of the plurality of light splitters is disposed in a recessed region of each of the plurality of unit pixel regions of the first substrate, and
wherein a sidewall of each of the plurality of light splitters is inclined.

5. The light sensor of claim 4, further comprising:
a refractive index difference part disposed between the sidewall of each of the plurality of light splitters and the deep trench isolation structure,
wherein each of the plurality of light splitters is a portion of the first substrate protruding from the recessed region of the first substrate toward one of the plurality of micro lenses.

6. The light sensor of claim 1, further comprising:
an anti-reflection layer disposed between the first substrate and the plurality of micro lenses; and
a planarization layer disposed between the anti-reflection layer and the plurality of micro lenses,
wherein the plurality of light splitters is disposed between the anti-reflection layer and the planarization layer.

7. The light sensor of claim 6,
wherein the plurality of light splitters includes a material having a higher refractive index than silicon.

8. The light sensor of claim 1, further comprising:
an amorphous structure that is in contact with a sidewall of the deep trench isolation structure.

9. The light sensor of claim 1, further comprising:
an interlayer insulating layer disposed on a bottom surface of the first substrate; and
a reflector disposed in the interlayer insulating layer.

10. The light sensor of claim 1, further comprising:
a second substrate electrically connected to the first substrate and including a plurality of unit memory regions,
wherein each of the plurality of unit memory regions stores data generated from one of the plurality of unit pixel regions.

11. The light sensor of claim 10,
wherein each of the plurality of unit memory regions includes a capacitor.

12. The light sensor of claim 10, further comprising:
a plurality of connection members connecting the first substrate to the second substrate.

13. The light sensor of claim 12,
wherein a predetermined number of unit pixel regions among the plurality of unit pixel regions is electrically connected to each of the plurality of connection members, and
wherein the predetermined number ranges from 1 to 64.

14. The light sensor of claim 10,
wherein the second substrate further comprises
a data processor processing electrical signals stored in the plurality of unit memory regions,
wherein the plurality of unit memory regions stores data of the plurality of unit pixel regions at substantially the same time; and
wherein the data processor sequentially senses the data stored in the plurality of unit memory regions.

15. A light sensor comprising:
a substrate having a first surface and a second surface opposite to the first surface including a plurality of unit pixel regions;
a photoelectric converter disposed in each of the plurality of unit pixel regions of the substrate;
a micro lens disposed on the second surface of the substrate overlapping one of the plurality of unit pixel regions;
a light splitter disposed between the micro lens and the photoelectric converter; and
a photoelectric-conversion-enhancing layer disposed between the light splitter and the photoelectric converter, wherein the light splitter is disposed at a focal point of the micro lens.

16. A light sensor comprising:
a substrate having an array of a plurality of unit pixel regions including a first unit pixel region and a second unit pixel region, each of the plurality of unit pixel regions including a photoelectric converter;
a plurality of light splitters including a first light splitter and a second light splitter, the plurality of light splitters being disposed on the substrate, the first light splitter being disposed at a first distance from a center of the first unit pixel region and the second light splitter being disposed at a second distance from a center of the second unit pixel region, wherein the second distance is larger than the first distance; and
a plurality of micro lens including a first micro lens and a second micro lens overlapping the first light splitter and the second light splitter, respectively,
wherein a center of the first micro lens and a center of the second micro lens are directly above the center of the first unit pixel region and the center of the second unit pixel region, respectively.

17. The light sensor of claim 16, further comprising:
a deep trench isolation structure penetrating the substrate and defining each of the plurality of unit pixel regions.

18. The light sensor of claim 16, further comprising:
a photoelectric-conversion-enhancing layer disposed within the first unit pixel region having a photoelectric converter,
wherein the photoelectric-conversion-enhancing layer is disposed between the first light splitter and the photoelectric converter.

19. The light sensor of claim 18,
wherein the photoelectric-conversion-enhancing layer includes an amorphous silicon layer.

20. The light sensor of claim 18,
wherein the photoelectric-conversion-enhancing layer includes an impurity injection region doped with impurities of at least one of germanium (Ge), sulfur (S), selenium (Se), tellurium (Te), lead (Pb), titanium (Ti), tantalum (Ta), tungsten (W), and nickel (Ni).

* * * * *